United States Patent [19]
Hendrickson et al.

[11] 4,089,103
[45] May 16, 1978

[54] MONOLITHIC INTEGRATED CIRCUIT DEVICE CONSTRUCTION METHODS

[75] Inventors: Thomas E. Hendrickson, Minneapolis; Jack S. T. Huang, New Hope; Wolfgang Tetzlaff, Hopkins, all of Minn.

[73] Assignee: Honeywell Inc., Minneapolis, Minn.

[21] Appl. No.: 693,049

[22] Filed: Jun. 4, 1976

[51] Int. Cl.² .............................................. B01J 17/00
[52] U.S. Cl. .................................... 29/577 C; 29/578
[58] Field of Search .......................... 29/577, 578, 571; 357/91

[56] References Cited

U.S. PATENT DOCUMENTS

| | | |
|---|---|---|
| 3,898,105 | 8/1975 | Mai .......................................... 357/91 |
| 3,933,528 | 1/1976 | Sloan ....................................... 357/91 |
| 3,947,866 | 3/1976 | Stelbrecht .............................. 357/91 |

*Primary Examiner*—W. Tupman
*Attorney, Agent, or Firm*—Theodore F. Neils

[57] ABSTRACT

Methods for monolithic integrated circuit construction are presented wherein component device-isolating region self-alignment is provided and also, where an element of the device is provided through independent dopant provision steps to allow design flexibility in providing that device element and associated integrated circuit devices. The method is especially applicable to bipolar device construction.

52 Claims, 36 Drawing Figures

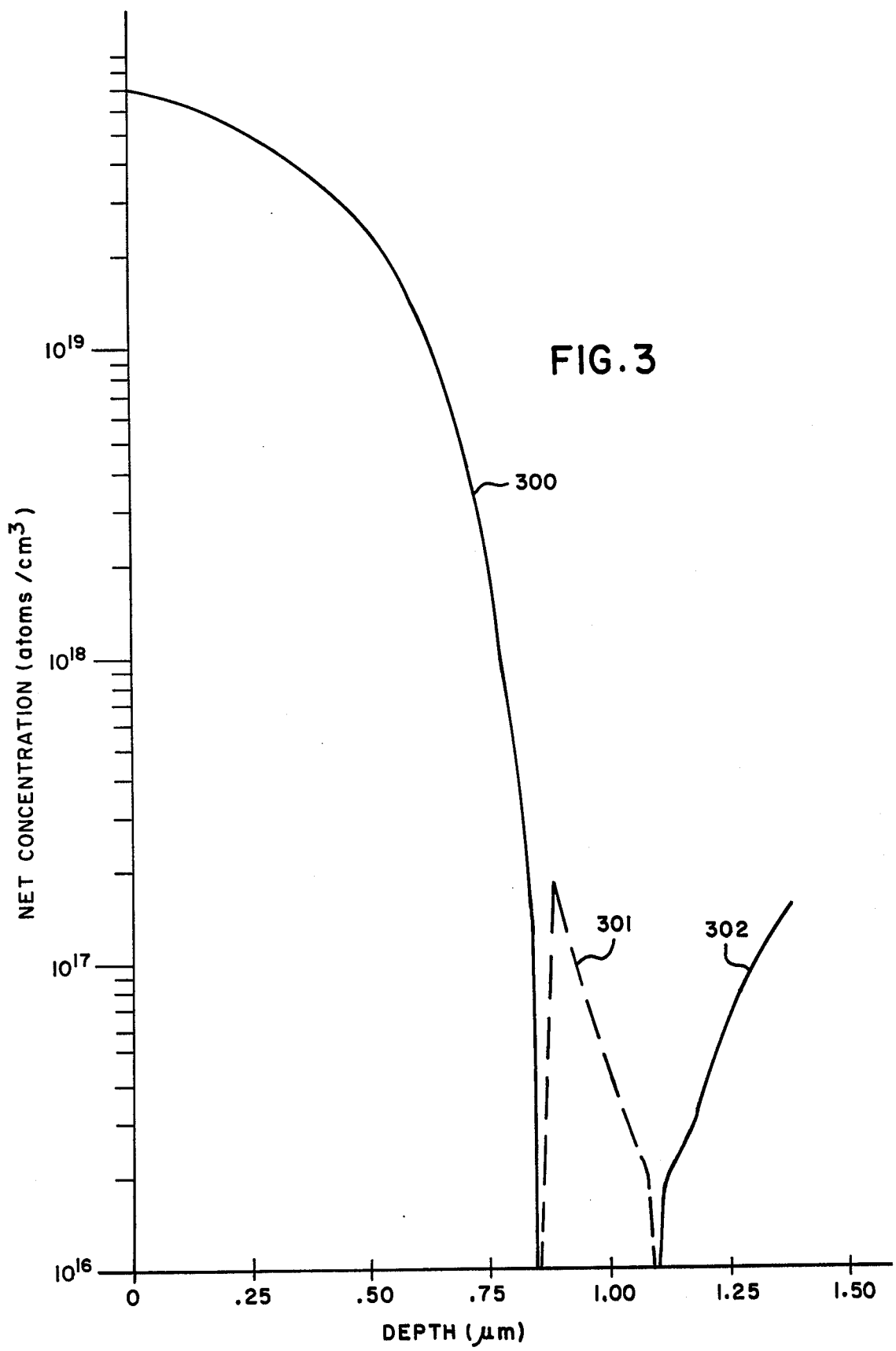

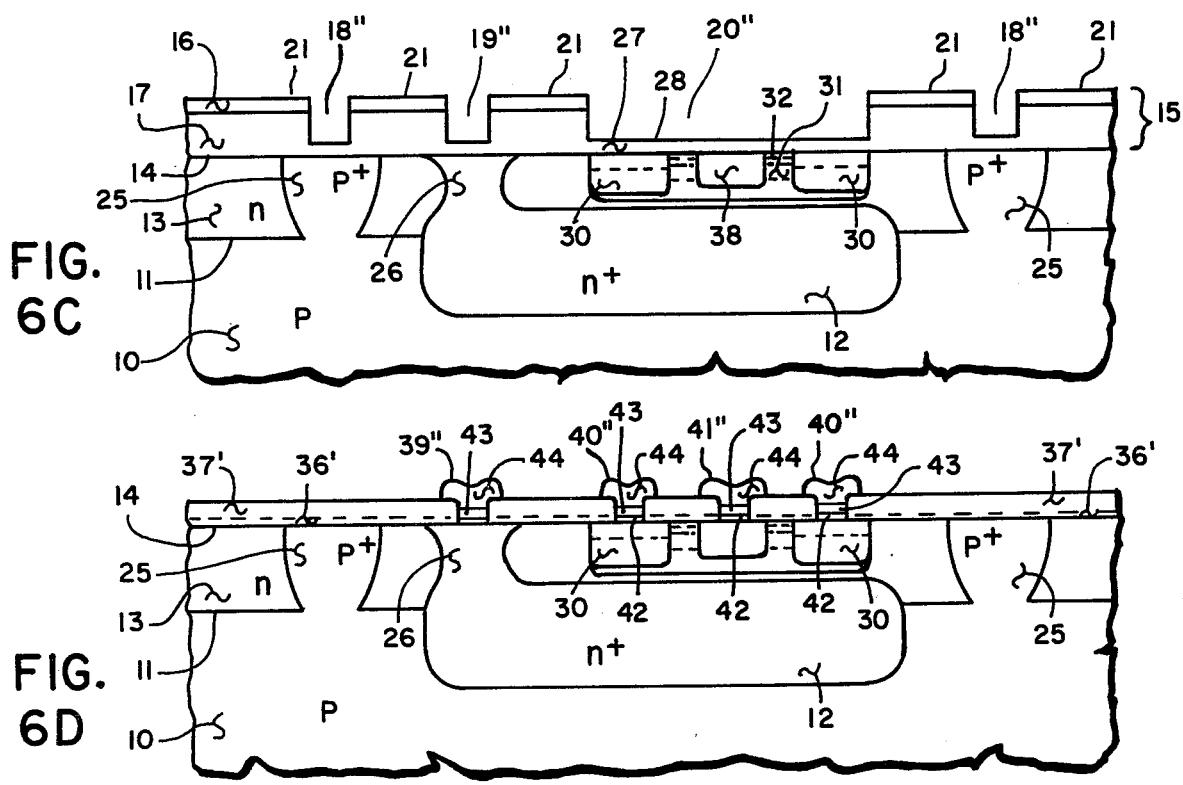
FIG. 6C
FIG. 6D
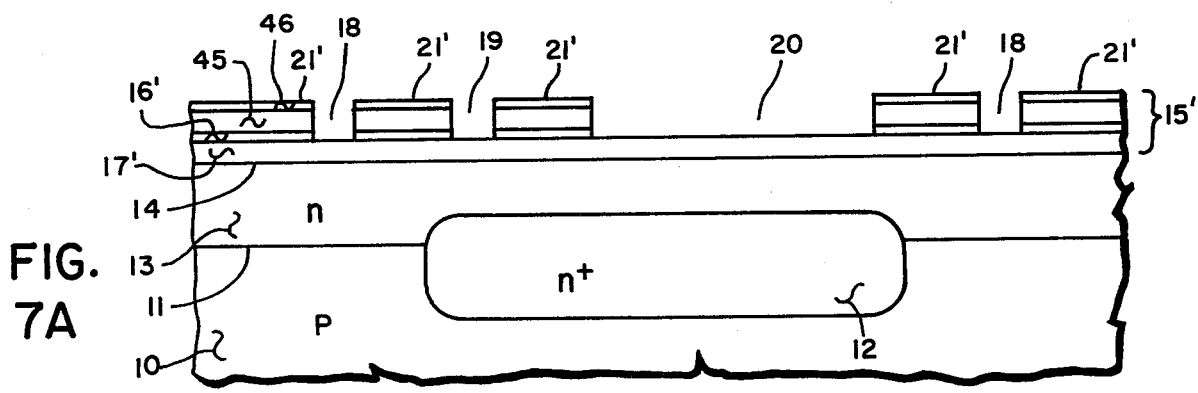
FIG. 7A
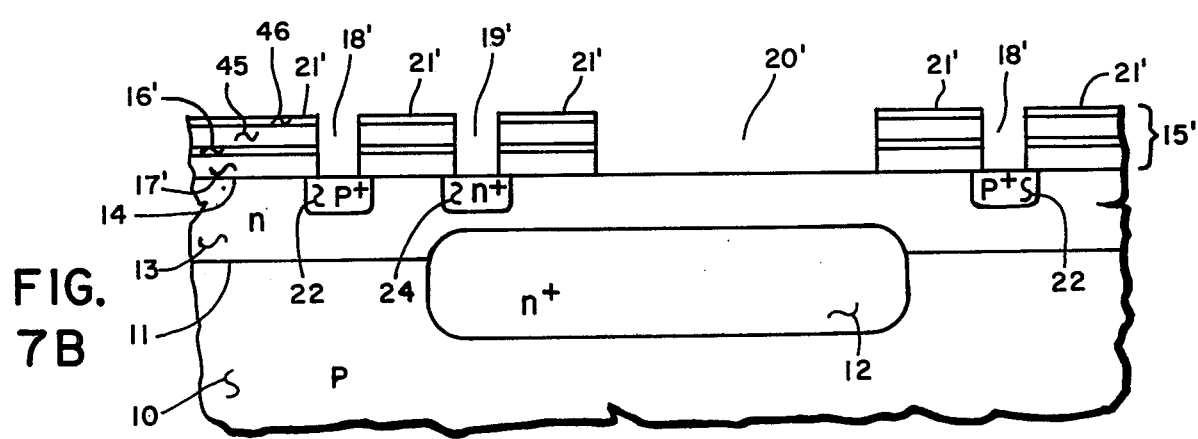
FIG. 7B

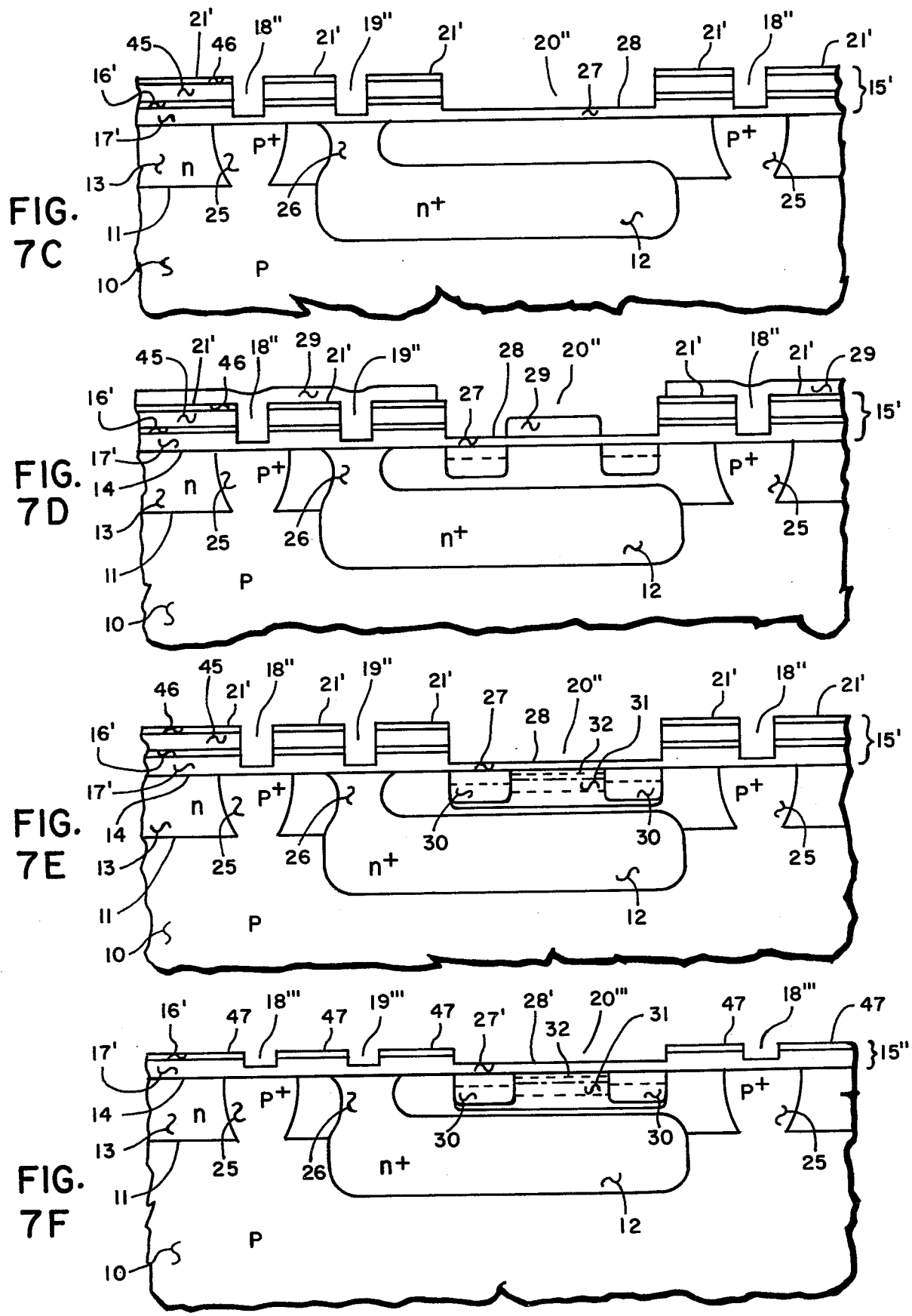

MONOLITHIC INTEGRATED CIRCUIT DEVICE CONSTRUCTION METHODS

BACKGROUND OF THE INVENTION

The invention herein relates to construction of monolithic integrated circuits having component devices therein which are to have very small geometries and wherein an element in a component device requires independent dopant provision steps to provide an optimum device element while simultaneously providing desirable elements in other and different component devices in the monolithic circuit. More particularly, the invention is related to bipolar transistor construction in monolithic integrated circuits and the associated components constructed therewith in the monolithic circuits such as integrated resistors.

Monolithic integrated circuits which are to perform a large number of circuit functions while meeting substantial performance standards require electronic component devices which are capable of as rapid operation as is possible and which have as small a geometrical layout as is possible. These requirements are quite compatible in that a small geometrical layout tends to be required for rapid operation of electronic component devices. The electronic component devices must also be provided simultaneously with other circuit component devices to form the monolithic integrated circuit, particularly, provided simultaneously with integrated resistors.

There are numerous difficulties in achieving these goals for electronic component devices in monolithic integrated circuits. First, the electronic component devices in the monolithic integrated circuit have often been made in the past with a series of masking steps which expose selected portions of the underlying integrated circuit material, usually silicon, for various processing steps to be performed at such exposed regions. Most often, these processing steps are diffusion, ion implantation and deposition. The use of a multiplicity of masks gives rise to relatively large tolerance requirements for the exposed portions because of cumulative mask and mask alignment tolerances leading to unduly large component device layouts. Mask alignment tolerances are required because of the failure to accurately align each mask in this series of masks with respect to one another and the underlying silicon during the series of processing steps.

In constructing bipolar transistors as electronic component devices in a monolithic integrated circuit, the performance of the transistor is determined essentially by the base geometry and resistivity, both of which are to vary depending on the position in the base region of the transistor for optimum performance. Yet these requirements for constructing an optimum base region are at some variance with the requirements for making integrated resistors which are often also constructed in an integrated circuit in conjunction with the construction of the base region. Further, the provision of the emitter region in the bipolar transistor can lead to base push-out. In a bipolar transistor of a small geometry, problems can also result from a spike of the emitter region passing through the base or a spike from the emitter contact passing through the emitter, these spikes leading to electrical shorts. These and other problems make the provision of such electronic component devices, those devices which have the desired small geometries and rapid operation capability, a difficult undertaking.

SUMMARY OF THE INVENTION

Methods are provided for constructing an electronic component device wherein at least some structural portions are formed by ion implantation and at least some structural portions are constructed in a manner to maintain relative positions with respect to one another through the construction process to reduce the required tolerances at various steps in the process. This is accomplished by use of a reference masking layer which is later removed at least in part. Furthermore, the method provides for constructing at least one region in the electronic component device in segments independent of one another to permit design flexibility for that device region and for other structures provided in the monolithic integrated circuit in conjunction with a device region so constructed.

The methods are particularly applicable to a bipolar transistor wherein the isolation regions, the sinker region, and the base region can be provided in fixed relative positions despite a sequence of processing steps being required to form each of these regions. The base region, which primarily determines bipolar transistor performance, can be constructed with a sequence of ion implantation steps while using a blocking layer to limit the effect of some of these implantation steps to thereby construct the base region in two or more segments. Integrated resistors for a monolithic integrated circuit can be constructed in conjunction with the construction of such a base region where the region for such resistors have practical resistivity values to allow resistors to be of reasonable sizes for a monolithic integrated circuit.

BRIEF DESCRIPTION OF THE DRAWINGS

FIG. 3 shows a graph representing net impurity distributions in the device of performing the method embodying the invention, FIGS. 6A–6D show the results of steps in the method embodying a variation of the invention, and FIGS. 7A–7J show the results of steps in the method embodying a variation of the invention.

DESCRIPTION OF THE PREFERRED EMBODIMENTS

FIG. 1 shows in cross section the results of a sequence of standard preliminary steps in the method of the invention used to construct a bipolar transistor in a monolithic integrated circuit, in this example an npn transistor. Other transistors are being similarly constructed in the monolithic integrated circuit simultaneously with the transistor shown in FIG. 1 but are not shown.

Figure 1A:
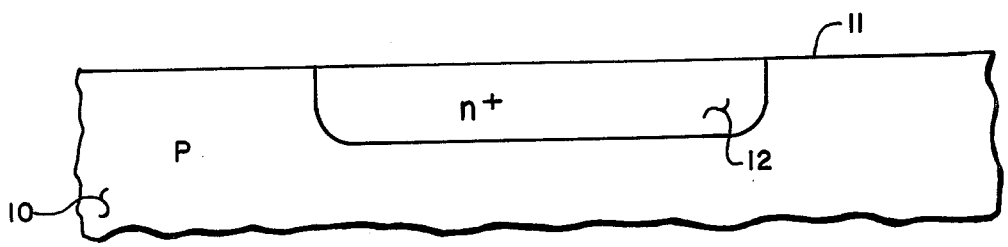
FIGS. 1A–1N show the results of the steps embodying the invention.

The method begins with a silicon wafer, a truncated portion of which is shown in FIG. 1A designated 10, which serves as a semiconductor substrate of a p-type conductivity having a relatively low conductivity. The resistivity, that is the reciprocal of the conductivity, is 8-12 Ω-cm. Substrate 10 has a substrate surface, 11, through which is provided a buried layer region, 12. The buried layer region has an n+-type conductivity with a sheet resistance of 10 Ω/□.

The buried layer region is provided by well-known processing steps. Typically, wet silicon dioxide or $SiO_2$ is grown on surface 11 to be used as a diffusion mask. There is an opening etched in the $SiO_2$ to expose surface 11 using photoresist provided in a standard positive photoresist process, as an etching mask. The opening in the $SiO_2$ is provided at a position with respect to surface 11 below which buried layer region 12 is desired to be provided. An arsenic doped source is spun-on and a diffusion cycle of 16 hours duration at 1,200° C in dry oxygen ensues. The pn junction which occurs between buried layer region 12 and substrate 10 has a depth at its deepest penetration of the substrate equal to about 4 μm. Thereafter, the $SiO_2$ diffusion mask is removed from surface 11. The result is shown in FIG. 1A.

Figure 1B:
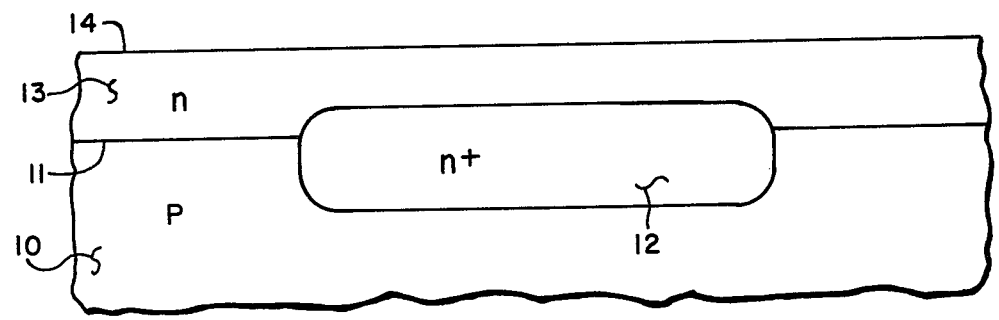

Next, an epitaxial layer is deposited on substrate surface 11 after cleaning that surface which becomes the interface between the resulting epitaxial layer, 13, and substrate 10 as shown in FIG. 1B. Epitaxial layer 13 has an outer major surface, 14, through which further processing steps will take place to provide the bipolar transistor. The epitaxial layer has an n-type conductivity through being phosphorous doped and a thickness of approximately 3 μm. The resistivity is 0.35 Ω-cm corresponding to a doping level of approximately $2 \times 10^{16}$ atoms/cm$^3$. As a result of the provision of epitaxial layer 13, buried layer region 12 has diffused partly into layer 13 and so now occurs at the interface between layer 13 and substrate 10 extending on either side of layer 11.

A barrier masking layer is next provided on outer major surface 14 of epitaxial layer 13 to serve as a mask for processing steps. The barrier masking layer, 15, is a composite layer consisting of two separate masking layers, a first masking layer of silicon nitride of $Si_3N_4$, 16, and a second masking layer of $SiO_2$, 17. The combined thicknesses of layers 16 and 17 to provide layer 15 must be chosen to prevent ions in any of the implantation steps yet to be performed from reaching outer major surface 14 from where they would pass into epitaxial layer 13 to form unwanted regions of varying conductivity or of a different conductivity type. This preventive feature of blocking layer 15 is to be effective, however, only where layer 15 has not been opened in preparation for providing desired regions of varying conductivity or of a different conductivity type in layer 13.

Since $Si_3N_4$ resists penetration of impinging ions to a greater degree than does silicon dioxide ($SiO_2$) in the same thickness, it is desirable to put a maximum amount of silicon nitride in barrier masking layer 15 to keep layer 15 as thin as possible to minimize undercutting in layer 15 when openings are provided therein by etching in connection with providing the desired regions in layer 13 of varying conductivity or of a different conductivity type.

However, $Si_3N_4$ is not perfectly matched with $SiO_2$ in thermal expansion characteristics, while $SiO_2$ is better matched in thermal expansion characteristics to the silicon in epitaxial layer 13. This leads to cracking occurring in the $Si_3N_4$ during temperature cycling in the following process steps. This means there is a limit to the thickness of $Si_3N_4$ which can be used in layer 5 of approximately 2,000 A. Thus, when the maximum $Si_3N_4$ thickness is used, the required ability of layer 15 to prevent ion penetration therethrough must be finally established through the providing of layer 17 in a sufficient thickness. For the following implantation steps chosen to provide the desired npn transistor, it has been found that choosing an $Si_3N_4$ layer 16 of 1,500 A is better rather than choosing a thickness at the very maximum thickness limit thus risking cracking. In this case, an $SiO_2$ layer 17 of 7,000 A is sufficient to provide penetration protection with a safety margin. Layer 16 must then not be less than 500 A for the 7,000 A thickness of layer 17 chosen. The result is, once the $SiO_2$ layer 17 is provided on surface 14 in a thickness of 7,000 A, there is a tolerance in the provision of the $Si_3N_4$ layer 16 of between 500 A and 1,000 A. Of course, in practice, there is a tolerance in the provision of layer 17 which will result in a smaller tolerance for layer 16.

Layer 17 is thermally grown on cleaned surface 14 of epitaxial layer 13 at 1,075° C to approximately a thickness of 7,000 A in a standard thermal oxide growth process. Thereafter, $Si_3N_4$ is deposited to a thickness of approximately 1,500 A in a standard deposition process to form layer 16 having an exposed surface, 21, serving as the major mask surface for barrier masking layer 15. This is followed by a 15 minute densification thermal cycle occurring in dry oxygen at 950° C for layer 17.

Figure 1C:
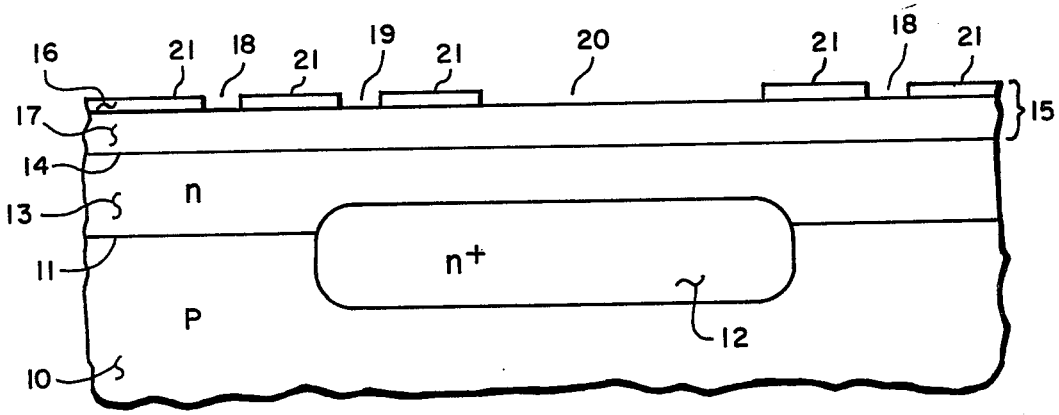

The result is shown in FIG. 1C but where certain openings have also been shown to be provided in layer 16. These openings in the $Si_3N_4$ layer 16 are done using a positive photoresist process to provide a photoresist etching mask. The openings in the nitride, 18, 19 and 20, are made by etching through this photoresist mask. The process used is a plasma etching process which is a standard etching process making use of the high differential etch rate between $Si_3N_4$ and $SiO_2$ to terminate the etching process through layer 16 at the point where the $SiO_2$ layer 17 surface is reached. Plasma etching of the $Si_3N_4$ is preferred since it can be accomplished in less time and produces less undercutting of the $Si_3N_4$ under the photoresist mask during the etching process.

Opening 18 is made as a first step in defining where the isolation regions will be located to form an electrically isolated portion of epitaxial layer 13, an isolation region, in which the npn bipolar transistor will be formed. Electrical isolation is required, of course, to prevent interaction between a bipolar transistor formed at one location in the monolithic integrated circuit and other bipolar transistors or other kinds of circuit devices being simultaneously formed in other portions of the integrated circuit. Opening 19 is the first step in defining where the sinker region from surface 14 to buried layer region 12 will be provided to give a low resistance path from surface 14 to the collector region of the npn bipolar transistor to be fabricated. Opening 20 is the first step in defining where the base region of the transistor is to be formed. Thus, the openings in layer 16 occur above all of the structural features which will be further provided in epitaxial layer 13 for the finally formed bipolar transistor. That is, the $Si_3N_4$ remains over regions of epitaxial layer 13 which will not have alterations occurring therein during the fabrication process to form bipolar transistor structural portions or to form isolation regions.

There are several advantages to this arrangement of openings in barrier masking layer 15 for providing the bipolar transistor structural features and the isolation regions. First, the $Si_3N_4$ (layers 16) - $SiO_2$ (epitaxial layer 13) series of layers always introduces thermally generated dislocations in the epitaxial layer 13 lattice structure during thermal cycling. This is due to the differing coefficients of thermal expansion in each of these materials. By placing the $Si_3N_4$ over the regions of epitaxial layer 13 left unaltered during the fabrication process as indicated above, these dislocations in the lattice are kept from occurring in the active regions of the bipolar transistor being fabricated—the very places where such dislocations cause leakage and excess recombination currents.

On the other hand, dislocations below the silicon in regions not serving actively in the bipolar transistor operation act as gettering sites to lock in place unwanted heavy metallic precipitates, etc. This leads to improve pn junction quality by immboliizing carrier lifetime killing impurities at locations away from the pn junctions and immobilizing metallic impurities at locations away from the pn junction which would otherwise cause anomalies in the electric fields present across the junctions. One consequence has been that the bipolar transistor current gain in the common emitter mode, beta ($\beta$), at low current levels is substantially improved, although this may be due at least in part to other fabrication factors also.

Further, "piping" in an epitaxial layer lattice structure also occurs with substantially greater frequency in the silicon at an $Si_3N_4$ - $SiO_2$ - Si interface. By not having such a sequence layers involving the silicon occurring in the emitter region, there results a substantial reduction of "piping" in that region. This is of particular importance in making high frequency bipolar transistors having very narrow bases and diffused emitters. Such pipes lead to emitter region diffusion spikes which may go right through the transistor base region to the collector region in narrow base transistors having shallow emitters.

There are further advantages in the process steps used in constructing the transistor in that the $SiO_2$ layer beneath the $Si_3N_4$ layer is not reached by the $SiO_2$ etchants used in some following process steps to provide openings in portions of the $SiO_2$ at locations where the $Si_3N_4$ has been removed to expose those portions of the $SiO_2$. In subsequent process steps, photoresist masks are used as etching masks over the $Si_3N_4$ and over parts of the exposed $SiO_2$ portions for providing openings in these exposed portions of $SiO_2$. The photoresist used for etching masks can have a number of kinds of defects such as pinholes, burst bubbles, defects due to dust on optical masks used in providing openings in the photoresist, etc. If the photoresist masks were provided directly on the $SiO_2$, the etchants used to dissolve $SiO_2$ through the designed and desired openings in the photoresist mask could also reach the $SiO_2$ at undesired locations through these mask defects. However, with the use of $Si_3N_4$, the $SiO_2$ etchants reach only the $Si_3N_4$ surface below the photoresist mask at defect locations therein without any degradation to the $SiO_2$ regions below so covered by the $Si_3N_4$. This is particularly important where small geometry electronic component devices are being constructed in a monolithic integrated circuit since a defect leading to a hole in the $SiO_2$ masking layer above the epitaxial layer is much more likely to expose an active region in a bipolar transistor being formed there below because of the high density of such components permitted.

Two other advantages can be cited. First, as opposed to the use of a masking layer consisting primarily of $SiO_2$ alone, there is no degradation in the barrier masking layer 15 using $Si_3N_4$ in addition to $SiO_2$ because of several successive openings in and so etchings of the masking layer, masking layer cleanings, etc., in later processing steps. Secondly, the locations of the $Si_3N_4$-$SiO_2$ layers above regions in the monolithic integrated circuit which are not part of active bipolar transistor regions eliminates several processing steps as compared to an inverse processing method wherein such composite masking layers are put over active regions in the bipolar transistor with the epitaxial layer surface exposed elsewhere.

Figure 1D:
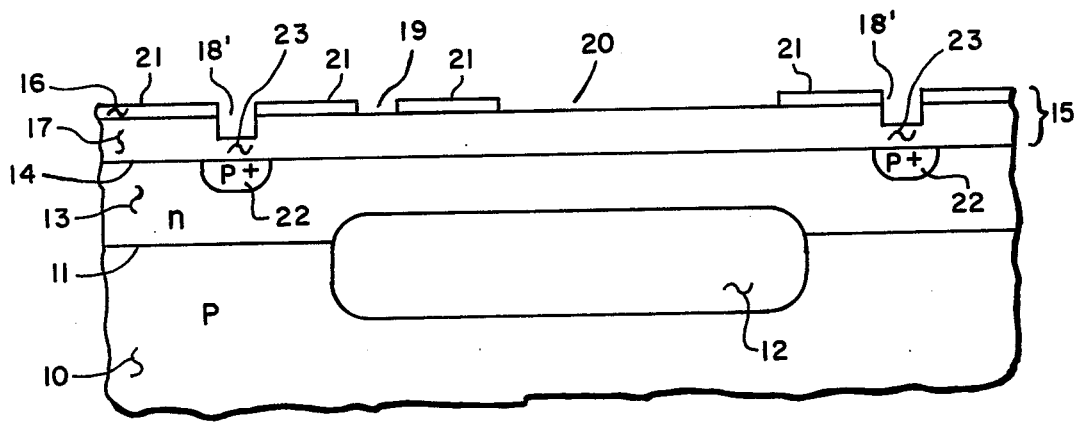

At the finish of providing openings 18, 19 and 20 in layer 16, a photoresist layer is provided as an etching mask over major mask surface 21 of layer 16, as opened, and this photoresist layer has an opening provided to just expose opening 18. This is done using a standard positive photoresist process. Thereafter, an etching step using buffered hydrofluoric acid in a 10:1 ratio is performed to provide an opening, 18′, in barrier masking layer 15 which extends all the way to outer major surface 14 from major mask surface 21 to expose a portion of surface 14. That is, this etching step is performed to etch an opening in layer 17 down to surface 14. The photoresist etching mask is then removed and the exposed portion of outer major surface 14 is cleaned. After cleaning, a predeposition is made to provide a p-type conductivity dopant diffusion source, 22, at the thusly exposed portion of surface 14. This predeposition is provided from a boron nitride deposition source at 1,100° C in a standard deposition process. The predeposition region 22 sheet resistance is about 17 $\Omega/\square$. After a cleaning of the deposition region, a covering layer, 23, of $SiO_2$ is grown over predeposition region 22 at 1,100° C in a standard silicon dioxide thermal growth process. Covering layer 23 provides the necessary shielding of region 22 during a subsequent deposition step. The results of these steps are shown in FIG. 1D.

Figure 1E:
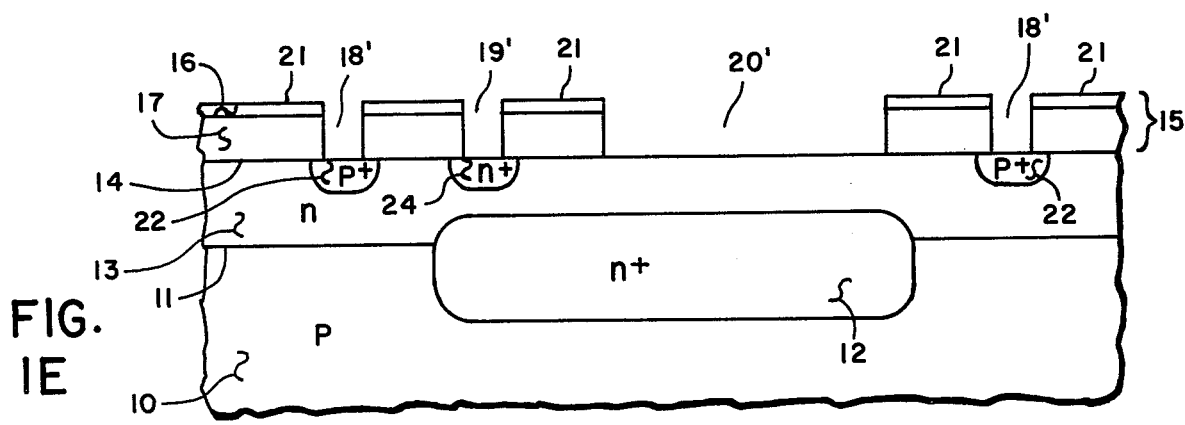

After covering layer 23 has been provided, a photoresist layer once again is provided as an etching mask over major mask surface 21. An opening is provided in this photoresist masking layer to expose only opening 19 in layer 16. Afterward, buffered hydrofluoric acid in a 10:1 ratio is again used to provide an opening in barrier masking layer 15 all the way to outer major surface 14, or again, to etch an opening in layer 17 down to surface 14 to expose a portion of surface 14. The photoresist etching mask is then removed, and the exposed portion of outer major surface 14 is cleaned. Next, a predeposition is again made to provide an n⁺-type conductivity dopant diffusion source region, 24, at the outer major surface 14 and just previously exposed. This predeposition is provided by using a gaseous phosphine deposition source in a standard deposition process. The predeposition diffusion region 24 has a typical sheet resistance of about 11 $\Omega/\square$. Thereafter, a further $SiO_2$ etching step is performed again by subjecting mask surface 21 and the $SiO_2$ exposed by the openings in layer 16 to buffered hydrofluoric acid in a 20:1 ratio to remove all of this exposed silicon dioxide. That is, covering layer 23 is removed in opening 18′, and layer 17 is opened all the way to outer major surface 14 through opening 20 to form opening 20′. The results of these steps are shown in FIG. 1E.

At this point a diffusion step is undertaken. The structure as shown in FIG. 1E is subjected to a temperature of 1,100° C for 80 hours in dry oxygen. This causes (i) predeposition diffusion region 22 to diffuse into an isolation region, 25, for the purpose of isolating electrically an isolated region in epitaxial layer 13 in which the npn transistor is to be formed, and (ii) to form a collector sinker, 26, such that a high conductivity path will be formed between buried layer region 12 and outer major surface 14.

Figure 1F:
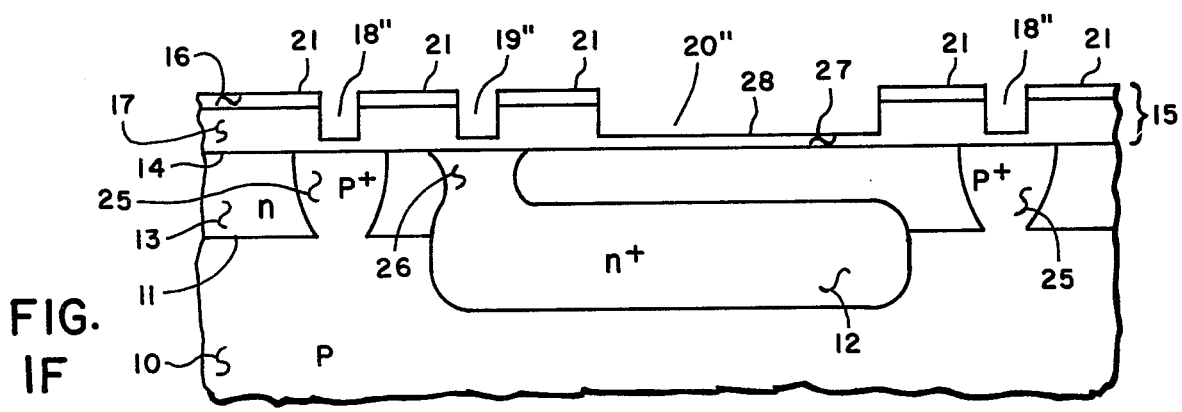

With the diffusion step being accomplished in dry oxygen, an SiO$_2$ layer grows thermally in each of the openings 18', 19' and 20'. The SiO$_2$ layer growing in opening 20' is to serve as a scattering layer, 27, to cause some scattering of impinging ions in subsequent ion implantation steps so the impinging ions do not happen to line up with the silicon lattice in epitaxial layer 13. Should such an alignment occur, the impinging ions would go much deeper than expected into epitaxial layer 13 for a given average ion energy in the absence of scattering layer 27. Scattering layer 27 has a scattering layer surface, 28, which defines the bottom of an ion implantation opening, 20", through which the base for the bipolar transistor will be formed. Thermally grown SiO$_2$ layers also grow in openings 18' and 19' and in so doing, define openings 18" and 19". The results are shown in FIG. 1F.

At this point, the construction of the base for the npn bipolar transistor begins. Three different ion implantation steps are used in the construction of this base in striving toward the goal of providing an optimum base configuration while at the same time providing the design flexibility required in constructing integrated resistors in other portions of the monolithic integrated circuit. Those integrated resistors are often provided in conjunction with the construction of base regions for bipolar transistors formed in the same monolithic integrated circuit.

The first portion of the base to be provided is termed the inactive base region portion which is that portion of the base region to which the base electrical contact will be made and which is not directly positioned between the emitter and the collector along the direction of primary transistor action in active transistor operation. The inactive base serves merely as a conductive path from the epitaxial layer surface to the operationally effective portion of the active base region which is located between the emitter and the collector along the direction of primary transistor action. As such, the inactive base is desirably heavily doped to have as high a conductivity as possible to reduce the effective base resistance. This being the case, any integrated resistors to be formed in the monolithic integrated circuit, which are desired to have relatively low resistance values, can be efficiently constructed simultaneously with the construction of the inactive base region.

To keep the inactive base region entirely separate from the active base region, a blocking layer, 29, is provided over the barrier masking layer 15 on major mask surface 21 as opened and over portions of scattering layer 27 on scattering layer surface 28. This blocking layer is used to confine the inactive base region to be formed in epitaxial layer 13 by an ion implantation step to being correspondingly located beneath just the portions of scattering layer 27 exposed by blocking layer 29. The active base region and the emitter will be later provided under unexposed portions of scattering layer 27. Blocking layer 29 is conveniently a photoresist layer.

Thus, a photoresist layer is provided as blocking layer 29 on major mask surface 21 as opened and on scattering layer surface 28 in a standard positive photoresist process but with openings provided in the photoresist layer over those portions of scattering surface 28 below which the inactive base region is desired to be provided. Of course, proper openings in this photoresist layer and in barrier masking layer 15 must also be provided at positions where low value resistors are to be provided in conjunction with the inactive base region implantation step. Obviously, other inactive base regions are to be simultaneously provided for the other transistors being constructed simultaneously with the transistor being constructed as shown in FIG. 1.

Figure 1G:
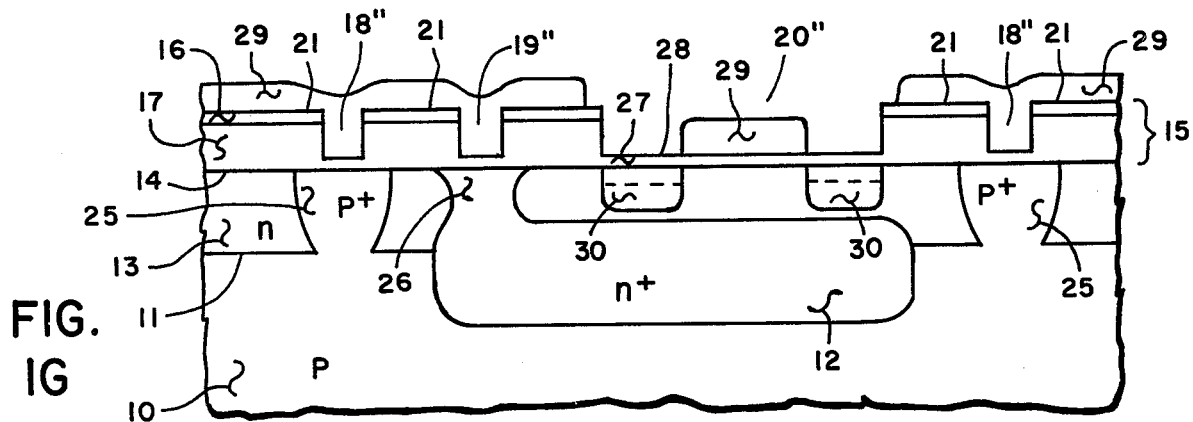

Upon completion of the blocking layer 29, or photoresist layer, with the necessary openings described above therein as shown in FIG. 1G, the inactive base ion implantation step is performed by subjecting the resulting structure to impinging ions, here boron ions. The boron ions are implanted into epitaxial layer 13 through ion implantation opening 20" except where blocked by layer 29 with an energy of 120 kev with a dose of $3.2 \times 10^{15}$ atoms/cm$^2$. The result of this implantation step is to provide an inactive base region, 30, of p$^+$-type conductivity which has an effective sheet resistance of 50 $\Omega/\square$. The pn junction formed between inactive base region 30 and the remainder of epitaxial layer 13, after all other processing is completed, occurs at a depth of 1 $\mu$m below surface 14 at the deepest location of the junction. The location of maximum ion concentration in region 30 occurs at 0.35 microns below surface 14 with a peak concentration of $3 \times 10^{19}$ atoms/cm$^3$. The results are shown in FIG. 1G where the dashed line in inactive base region 30 indicates the location of maximum ion concentration in that region due to the foregoing implantation step. Two regions are designated by the numeral 30 in that a base contact is to be made on either side of the active region yet to be provided.

With the completion of the inactive base region 30, the photoresist layer 29 is removed completely. Then the structure of FIG. 1G without layer 29 is ready for the active base region ion implantation steps. Two implantation steps are used in providing the active base region. The deepest implant forms a region of p-type conductivity which will essentially determine the bipolar transistor operating performance, except for the contribution of the base resistance occurring in the inactive base region. This deep implant region determines the resistivity of the portion of the active base region which is effective in the operation of the transistor and, in part, the width of this portion, i.e., the transistor base width.

The sheet resistance of a base which is satisfactory for bipolar transistor operation is generally too high a sheet resistance to be used satisfactorily in the coincidental construction of integrated resistors in other portions of the monolithic integrated circuit which are desired to have medium resistance values. Nevertheless, the deepest implant must provide portions in the resistor regions having a substantial fraction of the conductivity for the integrated resistors. This is because substantial fractions of each of the possible resistor regions can only be reached to alter its conductivity by this deep implantation step to thereby permit a wide range of effective sheet resistance values to be available for the integrated resistors. A resolution of this conflict between the required base sheet resistance value and the desired resistor region sheet resistance value is achieved in two ways.

First, two implantation steps are used to form the active base region. In addition to the deep implantation step, there is also a shallow implantation step performed. The shallow implantation step will have no effect on the operation of the bipolar transistor over a substantial range of implantation energies and dosages as the region formed by the shallow implantation will be entirely compensated by the emitter region where the shallow implant region intersects the emitter region when the latter region is formed. The portions of the resistor regions formed by the shallow implantation step, however, will not be compensated in the formation of integrated resistors and so will act to modify the conductivity of the overall effective resistor regions which include the portions formed by the deep implantation step. The combination of (i) the deep implantation step contributing substantially to the resistor conductivity, and (ii) the relative freedom in the choice of energy and especially dosage for the shallow implantation step means that designs of integrated circuits can be quite flexible since a substantial range of resistor sheet resistances can be made available in the process being described in connection with FIG. 1.

Also, the shallow implanted regions formed in connection with the transistors being formed in the monolithic integrated circuit can be provided to surround the emitter regions at points which would not be included in the inactive base region at positions just below the surface 14 where there occurs an $SiO_2$—Si interface. In these locations, the shallow implant regions prevent inversion layers from forming beneath the $SiO_2$, which could short the transistor emitter region to the collector, and they are effective in reducing the base resistance.

The second way in which the conflict involving sheet resistance values for base regions and for integrated resistor regions is resolved is to have the emitter region formed deeply enough in epitaxial layer 13 so that the pn junction occurring between the emitter and the base region occurs at a deeper location than does the peak ion concentration provided in the deep implantation region of the active base region. The effective portion of the active base region is, of course, that portion of the deeper tail of the deep implantation region distribution, provided for the active base region, which is not compensated by the provision of the emitter region, i.e., that portion of the deeper tail of the deep implantation region below the base-emitter junction. Thus, the emitter-base junction occurs in the deeper tail portion of the deep implantation region so that the peak carrier concentration in the portion of the active base region which is effective in the operation of the transistor is substantially lower than the peak that occurs in the deep implantation region taken as a whole. This substantially lowers the effective sheet resistivity in the operationally effective base.

Figure 2:
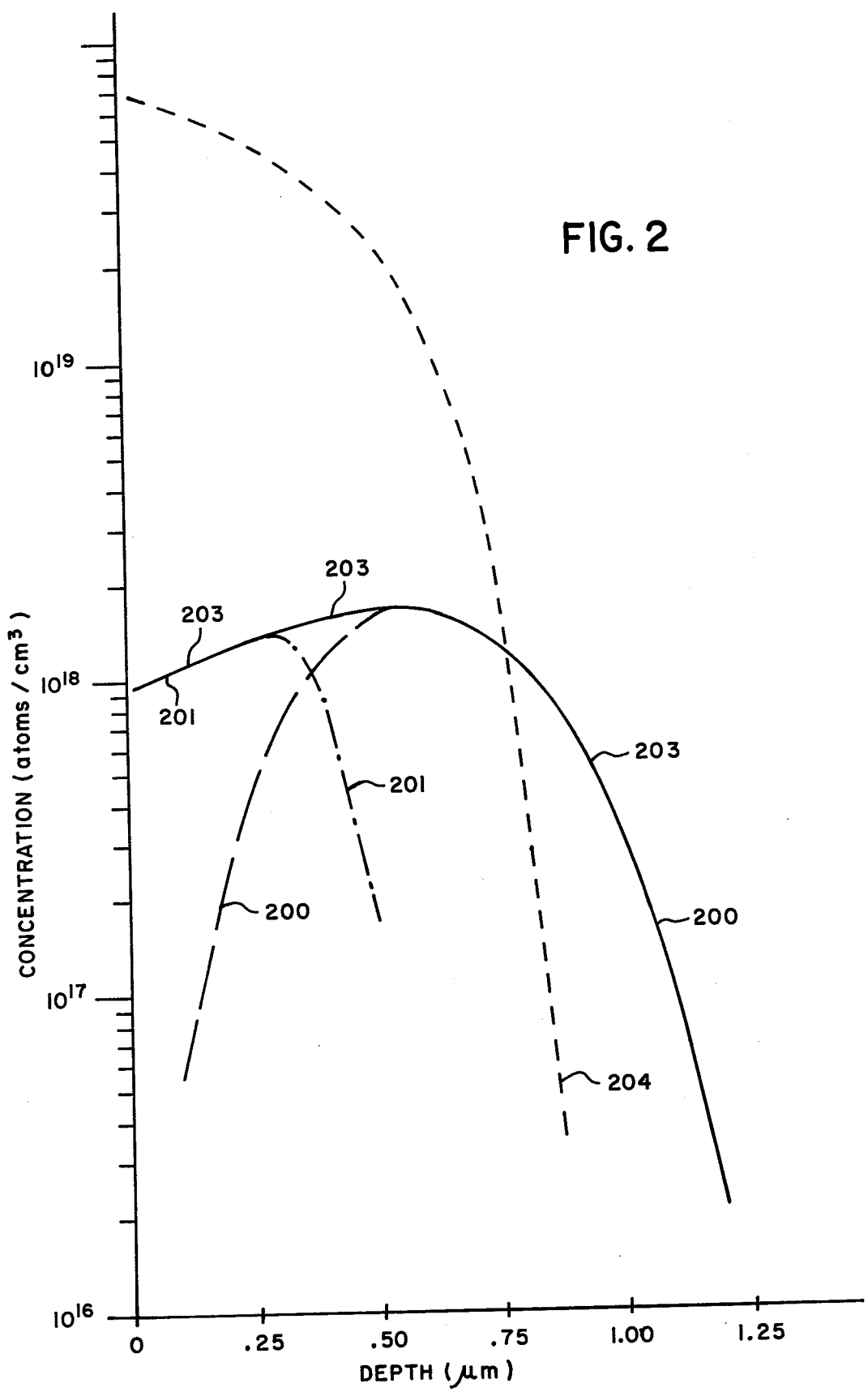
FIG. 2 shows a graph representing impurity distributions in the device of performing the method embodying the invention.

This can better be understood by referring first to FIG. 2 and then to FIG. 3. FIG. 2 first shows the two spatial distributions of implanted ions in one dimension as a result of the two implantation steps used in providing the active base region and after all processing steps involving substantial temperatures have been completed. The distribution of ions due to the deep implantation step is represented by the curve of long dashes labeled 200 (part of which is overlaid by a solid line curve) and the ion distribution due to the shallow implantation step is represented by the curve of long dashes labeled 201 (part of which is overlaid by a solid line curve). The composite curve which represents the total distribution of ions due to both implantation steps in epitaxial layer 13 is represented by a solid line curve labeled 203. Finally, the curve of short dashes labeled 204 represents the spatial distribution of diffused n-type impurity atoms (arsenic) later provided to form the emitter region. Note curve 204 intersects curve 203 below the peak point of the latter. Easily seen is that the emitter impurity atom concentration is provided having a peak level considerably in excess of the peak ion concentrations present in the active base region with this excess continuing to occur until locations are reached which are substantially deeper than the location of maximum ion concentration in the active base region.

Turning to FIG. 3, the excess dopant atom or ion concentrations, i.e., the net concentrations of dopant atoms or ions, are plotted through the emitter region, base region and collector-buried layer regions sequence. The solid curves represent regions where n-type dopant atoms are in the majority while the dashed curve represents a region where the p-type dopant ions are in the majority. The solid curve labeled 300 corresponds to the emitter region while the solid curve 302 corresponds to the collector and buried layer regions, the latter curve showing that the buried layer region often comes into contact with the active base region so at the least it is very closely adjacent thereto. The dashed curve labeled 301 corresponds to the portion of the active base region which is effective in the operation of the transistor.

All the curves shown in FIGS. 2 and 3 are approximately in final configuration after all processing is completed. They were measured by use of a spreading resistance measurement technique. Depths are from outer surface 14.

When the emitter region and the operationally effective portion of the active base region is to be provided in this fashion, it is very desirable that the tail of the distribution forming the deep implantation region, provided as part of the active base region, be as steep as possible as opposed to tailing off more gradually. This is also true of the emitter dopant atom distribution. When both of these distributions fall off steeply, a relatively precisely defined base width (distance across curve 301 in FIG. 3) can be fabricated while simultaneously providing the base with the necessary sheet resistance value to provide a bipolar transistor capable of very rapid operation.

Achieving a steep tail in the ion distribution forming the deep implantation region of the active base region requires that this deep implantation region be not very deep into epitaxial layer 13. Further, an arsenic dopant should be used to form the diffused emitter region to prevent base push-out, and the emitter region formation step should otherwise be such as not to cause any significant redistribution of the implanted regions forming the active base region due to diffusion thereof.

Returning now to FIG 1H, the result of providing the active base region in two implantation steps is shown. A deep implantation region is designated by numeral 31, and a shallow implantation region is designated by numeral 32. The separation between these two regions is shown by a line of long and short dashes. A short dashed line in each region shows the location of maximum ion concentration in each.

Figure 1H:
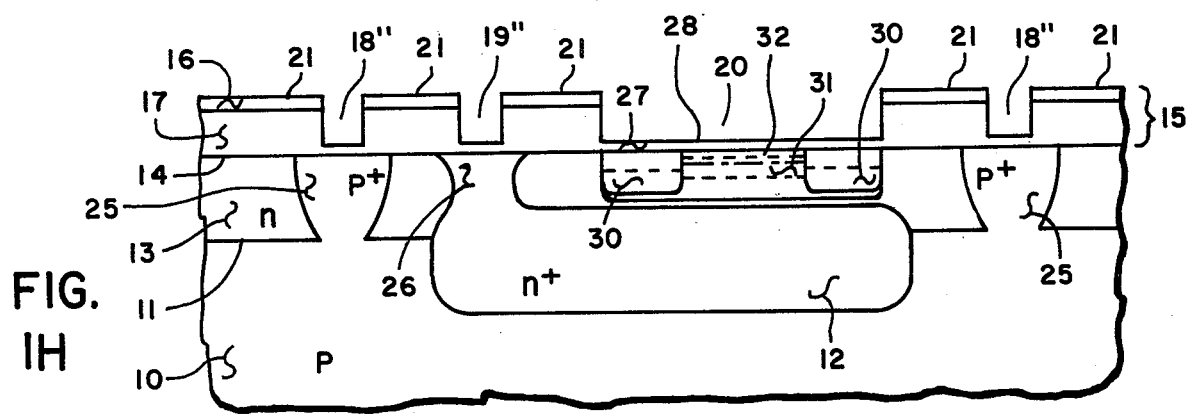

With the blocking layer 29 shown in FIG. 1H removed, the structure of FIG. 1H is achieved by first undertaking the deep implantation step to form deep implantation region 31 of p-type conductivity. This is accomplished by implanting boron ions, having an implantation energy of 190 kev, on the structure of FIG. 1H without layer 29 through both ion implantation opening 20" and scattering layer 27 into epitaxial layer 13. The barrier masking layer 15 prevents implantation in epitaxial layer 13 at all points where layer 15 is not opened. Where layer 15 is opened in addition to opening 20", that is in openings 18" and 19", the concentration of carriers in epitaxial layer 13 below those openings is so great, due to the earlier depositions involving these openings that the two implantation steps to form the active base region do not alter the conductivity type of those regions from what it was prior to these implantation steps. The dose provided for the deep ion implantation step is $3 \times 10^{13}$ atoms/cm$^2$ which leads to a peak concentration of approximately $1.55 \times 10^{18}$ ions/cm$^3$ located at approximately 0.55 μm below surface 14. The deeper pn junction formed between deep implantation region 31 and epitaxial layer 13 (or buried layer 12) occurs at a depth below surface 14 of about 1.10 μm.

The deep implantation step is immediately followed by the shallow implantation step to form shallow implantation region 32 also of p-type conductivity. Boron ions are again implanted in epitaxial layer 13 through ion implantation opening 20" having an implantation energy of 100 kev and, for instance, a dose of $1.0 \times 10^{14}$ atoms/cm$^2$ leading to a final peak concentration of approximately $1.4 \times 10^{18}$ atoms/cm$^3$ at a depth below surface 14 of about 0.25 μm. The active base region (comprising regions 31 and 32) intersects the inactive base region 30 but have little effect thereon because of its being of the same conductivity type and being more heavily doped. Hence, regions 31 and 32 are shown merged with region 30 in FIG. 1H. Taking the active base region as a whole, that is, both regions 31 and 32, the effective sheet resistance for that region obtained by the above steps is 500 Ω/□.

Of course, where desired, the shallow implantation step forms portions of selected regions where integrated resistors are to be provided in the monolithic integrated circuit. Since this shallow implantation step will have little effect on the operation of the transistors in the integrated circuit, its dosage may be chosen over a substantial range to provide a varying effective sheet resistance in the resistor regions of the integrated circuit, either due to this shallow implantation step solely or to the combination of both the shallow and the deep implantation steps. Thus, useful sheet resistance values can be provided for a wide range of integrated resistor resistance values.

Following these implantation steps, the structure is subjected to an annealing cycle at 950° C for 15 minutes in dry nitrogen. This is to cause the implanted ions to become electrically active while also preventing the formation of most dislocation loops, i.e., growth of dislocations in the epitaxial layer 13, during subsequent provision of a new layer of SiO$_2$ on epitaxial layer 13. The structure after annealing is shown in FIG. 1H.

After annealing, barrier masking layer 15 is entirely removed from outer surface 14 of epitaxial layer 13. This can be accomplished by etching the Si$_3$N$_4$ away with hot phosphoric acid for 60 minutes. Then there is an etching away of the SiO$_2$ by use of buffered hydrofluoric acid having a 10:1 ratio.

This is followed by providing a new layer of SiO$_2$ on outer major surface 14, this layer being started by first thermally growing 1,500 A of SiO$_2$ on outer major surface 14 at 950° C for 60 minutes. The low temperatures used here and in the earlier annealing step are chosen to avoid significant diffusion and hence redistribution of the already implanted regions 30, 31 and 32. Providing a rather thin grown oxide reduces the time at the 950° C temperature and also limits leaching of the dopants present in epitaxial layer 13 out of that layer into the growing SiO$_2$. SiO$_2$ is grown in a dry atmosphere rather than a wet atmosphere in this step to reduce the formation of dislocations, surface defects, etc. Thereafter, 2,000 A of undoped SiO$_2$ is deposited by a standard chemical vapor deposition methods upon the just previously grown SiO$_2$ to form the completed SiO$_2$ layer to serve as an interconnection support layer, 33, for the interconnection metallization network to be later provided.

Completely exposing outer major surface 14 and the junctions terminating therein has not been found to be detrimental to the yield of monolithic integrated circuits in the present process using the techniques recited and the equipment currently available to implement these techniques. No undesirable contamination, etc., has developed lowering yields. However, should such a problem arise, the process can be modified to keep the junctions covered at all times in a manner set out below.

There are, on the other hand, substantial benefits to using a completely new SiO$_2$ protective layer over outer major surface 14. The major mask surface 21 of barrier masking layer 15 cannot be used, in any case, to support the device interconnection metallization system. This is because the thickness of barrier masking layer 15 is too great to assure physical and electrical continuity of the interconnection metallization system in those portions of it which would be deposited over edges of openings in layer 15 to make an electrical contact to regions in the epitaxial layer 13 exposed by these openings. Removing barrier masking layer 15 entirely and substituting a new, thinner interconnection support layer of silicon dioxide also results in a very smooth surface being provided for supporting the interconnection metallization system. The resulting SiO$_2$ layer 33 is shown in FIG. 1I having an interconnection support layer surface, 34.

Figure 1I:
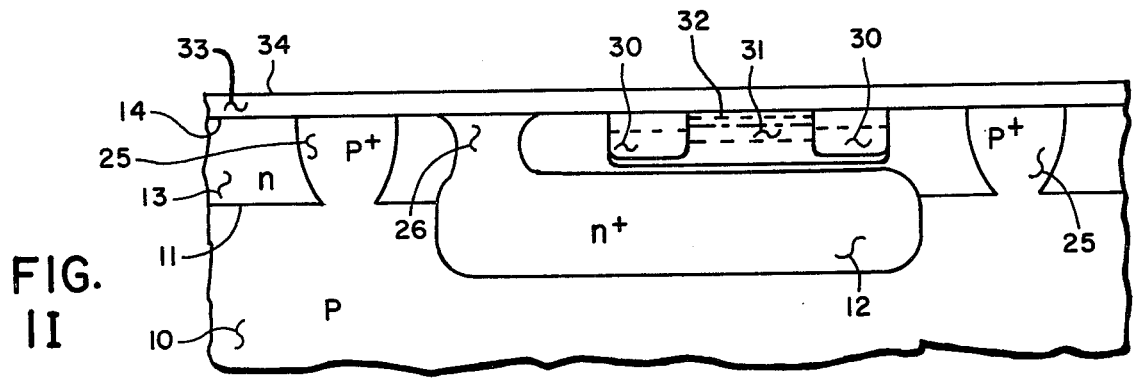

The structure shown in FIG. 1I is now ready to have the emitter region provided therein for the bipolar transistor. As earlier stated, the step of fabricating the emitter region must be such as not to seriously distort the already provided inactive and active base regions by causing undue diffusion thereof. Also, since the emitter will be quite shallow, provision must be made for making electrical contact thereto without damaging the finished very shallow emitter region. These goals can both be accomplished by using a polysilicon emitter diffusant source which is heavily doped with arsenic atoms, in excess of $1.0 \times 10^{20}$ atoms/cm$^3$, to take advantage of the concentration dependent diffusivity of arsenic to thereby increase its diffusion rate.

The use of such an emitter diffusant source leads to providing a tail distribution in the emitter region that falls off very steeply from a large concentration value as shown in FIG. 3 which is required for, as earlier stated, the purpose of maintaining a narrow base width for the transistor, and for providing a high emitter injection efficiency. The emitter dopant, arsenic, is also thereby diffused at a rate comparable to or greater than that of the boron in the active base region which prevents the boron from diffusing too far in the emitter region fabrication step which would also lead to an unduly large transistor base width. Finally, the use of arsenic eliminates the push-out effect of the base found when a phosphorus dopant is used for the emitter which would also limit the thinness of the transistor base.

In addition, with polysilicon as the emitter diffusant souce, there is no need to have the interconnection metallization system physically contact the emitter to provide an electrical connection, but rather, that electrical contact can be effected through the doped polysilicon itself which can be provided with a larger surface area than the emitter region has in surface 14. This use of a polysilicon diffusant source eliminates needing undesirably larger emitter tolerances to avoid having the interconnection metallization network system mismatched to the emitter during provision of this network and eliminates the risk of the metal in the network spiking through the emitter to the base thus shorting out the emitter.

The structure shown in FIG. 1I is subjected to a densification step for layer 33 by placing the strucure at 950° C in dry oxygen for 15 minutes. Thereafter, photoresist is used as an etching mask in a standard positive photoresist process to provide an opening in interconnection support layer 33 through which to provide the emitter. The opening is etched in layer 33 by etching with buffered hydrofluoric acid in a 20:1 ratio through an opening provided in the photoresist etching mask. The photoresist etching mask is afterwards entirely removed and, following the cleaning of surface 34, arsenic doped polysilicon is deposited to a depth of about 3,000 A by a standard chemical vapor deposition process on interconnection support layer surface 34 and on the exposed portion of outer major surface 14 through the opening just provided in layer 33.

Figure 1J:
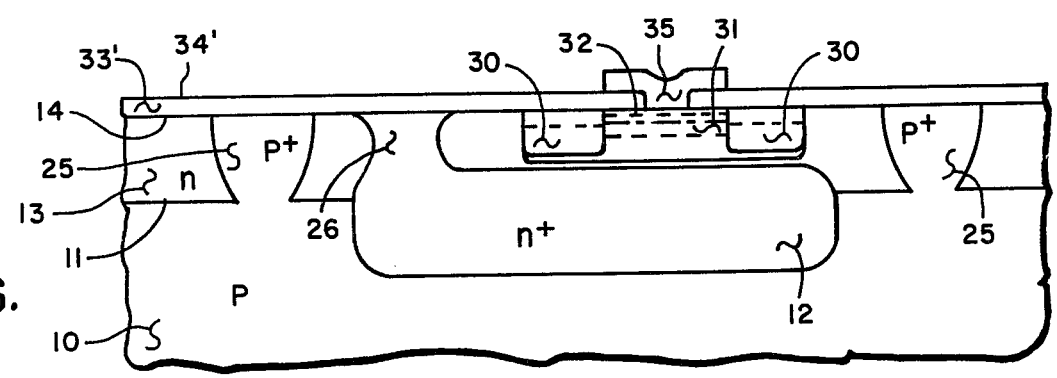

Then $SiO_2$ is either grown or deposited on the polysilicon layer, and a standard positive photoresist process is used to remove portions of the $SiO_2$ just provided which occurs above regions of the polysilicon which are not to be used as part of the emitter diffusant source and electrical contact. The remaining $SiO_2$ on the polysilicon serves as an etching mask in removing the unwanted polysilicon which is not to be used as part of the emitter diffusant source and electrical contact. This can be done with a heated solution of nitric acid, hydrofluoric acid and acetic acid in ratios of 10:1:11, a standard polysilicon removal process. A following oxide etch using buffered hydrofluoric acid in a 20:1 ratio for 3 minutes removes the $SiO_2$ etching mask on the polysilicon (as well as some of silicon dioxide layer 33 now layer 33' having surface 34'). The polysilicon emitter diffusant source, 35, is shown in FIG. 1J.

After cleaning, an additional undoped $SiO_2$ layer, 36, is provided over surface 34' and over emitter diffusant source 35 in a standard chemical vapor deposition process to a depth of 1,500 A. This is provided prior to a subsequent deposition of a layer of phosphorous doped $SiO_2$ to help avoid having the phosphorous dopant in the $SiO_2$ penetrate to outer major surface 14. A layer of $Si_3N_4$ could be provided over the remainder of $SiO_2$ layer 33' if desired, prior to providing the undoped layer of $SiO_2$, to provide a better passivation layer, although this has not been found necessary.

A 10% phosphorous doped $SiO_2$ layer, 37, is then provided on layer 36 just provided. Layer 37 is provided to a depth of 2,500 A. The use of phosphorous doped $SiO_2$ provides a layer which will at least partially liquify and flow during the following emitter diffusion step to thereby result in smoothing the corners that have occurred during processing, such as at the emitter diffusant source 35, to provide a smooth surface to support the interconnection metallization network. Phosphorous doped $SiO_2$ also is more impervious to most contaminants migrating therethrough. Layers 36 and 37 are shown in FIG. 1K.

Figure 1K:
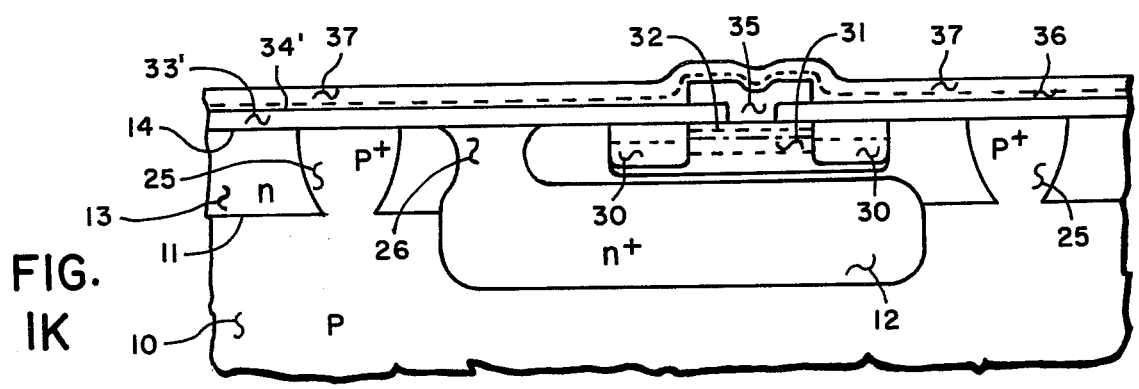

The structure of FIG. 1K is submitted to a diffusion cycle of 52 minutes in length at 1,025° C to provide an n-type conductivity emitter region, 38, with the emitter-base pn junction being formed below outer major surface 14 at a depth of approximately 0.85 μm. The emitter region thus formed has a sheet resistance of approximately 10 Ω/□. This result is shown in FIG. 1L where, as can be seen, the base-emitter pn junction occurs deeper in the epitaxial layer than does the peak ion concentration location in deep implantation region 31 in agreement with FIG. 3.

Figure 1L:
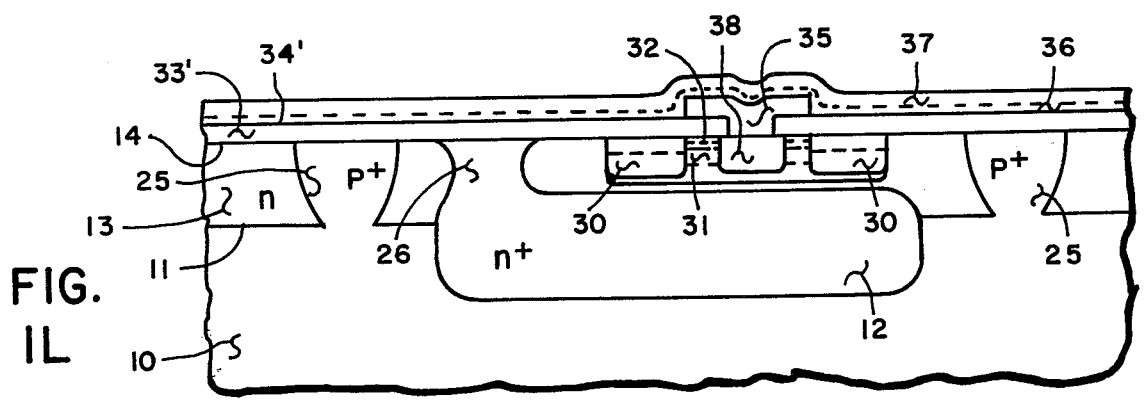

Of course, several of the regions formed above now intersect one another as shown in FIG. 1L to form an npn bipolar transistor. That is, emitter region 38 intersects shallow implantation region 32, passing entirely therethrough and compensating that region within emitter region 38. Emitter region 38 further intersects deep implantation region 31, again entirely compensating that portion of region 31 within emitter region 38. Regions 31 and 32, which together form the active base region, intersect one another as initially provided which is shown in FIG. 2. Both regions 31 and 32 also intersect inactive base region 30 as a result of the implantation steps set out above in providing these regions.

Figure 1M:
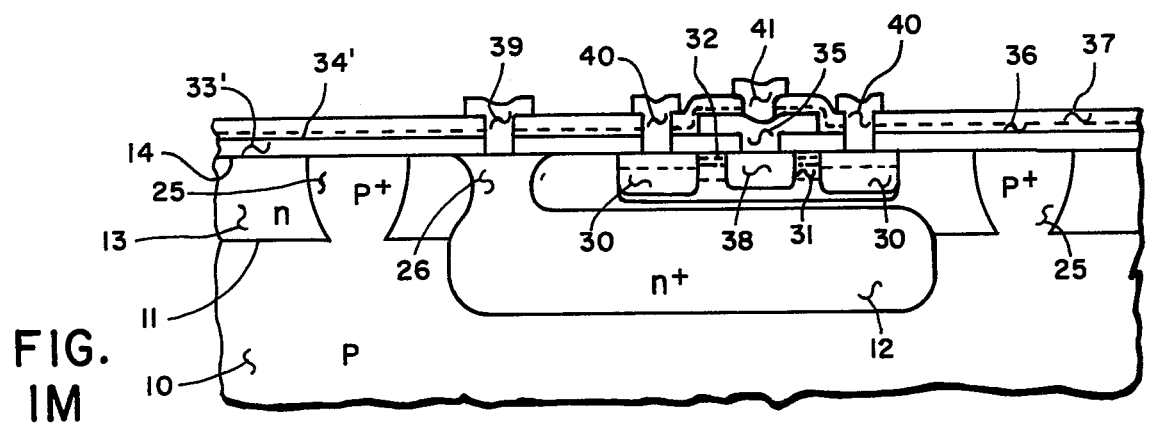

$SiO_2$ layers 36 and 37 are opened above the polysilicon diffusant source 35, and layer 33', 36 and 37 are opened above inactive base region 30 and above the sinker 26 by use of a standard positive photoresist mask provided as an etching mask. Openings are provided in the photoresist mask above these positions, and the $SiO_2$ layers are etched open at these positions to expose both diffusant source 35 in part and the pertinent portions of outer major surface 14. This etching is accomplished by etching through the opening in the photoresist using buffered hydrofluoric acid in a 20:1 ratio. Thereafter, standard metallization deposition techniques can be used to provide a collector contact to sinker 26, base contacts to inactive region 30 and an emitter contact to polysilicon diffusant source 35. A satisfactory metal is aluminum. The result is shown in FIGS. 1M and FIGS. 1N where a collector contact, 39, and base contacts, 40, and an emitter contact, 41, are shown (only the cuts for these contacts in the $SiO_2$ layers are shown in FIG. 1N and these cuts are designated with the numerals 39', 40' and 41', respectively).

Figure 1N:
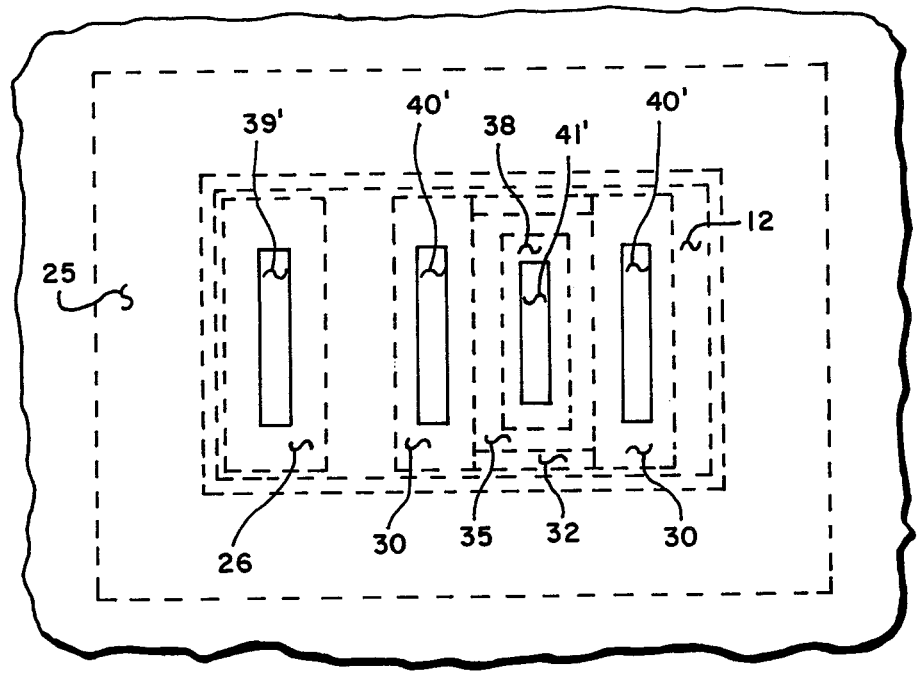

FIG. 1N gives a top view of the resulting bipolar transistor without the metallization being shown. The outer dimensions on the isolation region 25 are 60 by 75 μm. The smallest device made at present has had dimensions of 27 μm by 36 μm. This minimum size is determined to a substantial extent by the behavior of the photoresist used as described in the preceding process. Where an electron beam resist is used or some other resist which would give finer resolution than the standard positive photoresist processes, smaller dimensions could be achieved. Transistors constructed by the preceding process, having the larger dimensions set out above, have achieved a switching time of 0.45 nsec.

As noted previously, the connection in FIG. 3, the buried layer region diffuses upward during processing to come into contact with the operationally effective base region to some extent or to nearly do so. This is necessary to reduce the effective collector resistance but there are definite limits since this results also in both a lowered breakdown voltage across the base-collector junction and an increase in capacitance across this junction. Typically, $BV_{CBO}$ is 15 to 20 volts and $C_{bc}$ is 0.55 pf.

Figure 4A:
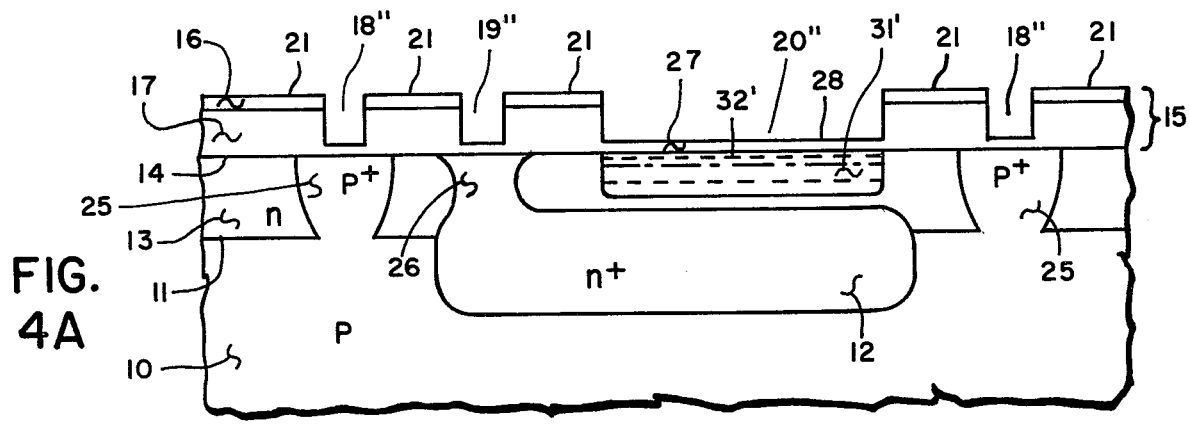
FIGS. 4A and 4B show the results of steps in the method embodying a variation of the invention.
Figure 4B:
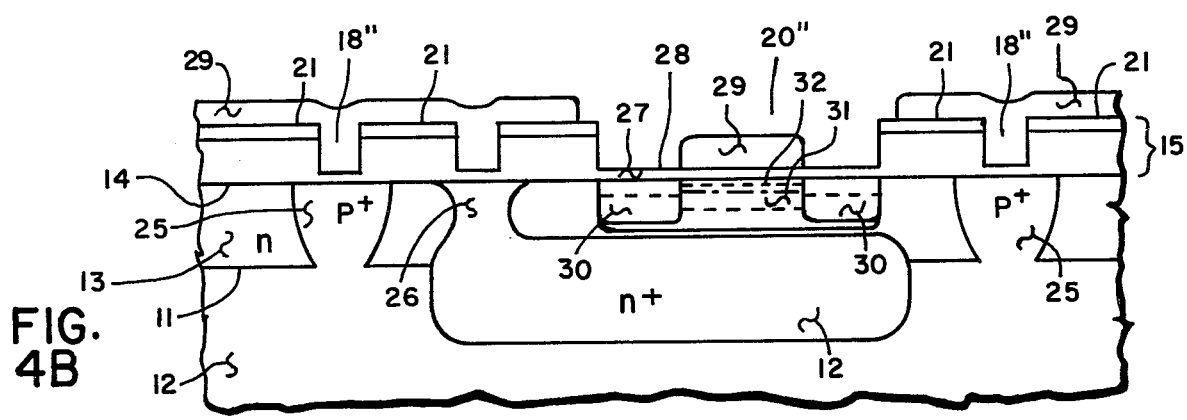

Because of the flexibility in the steps of the foregoing process, several variations thereof are possible which still retain the advantages of a self-aligned base, sinker and isolation regions and of a base constructed in several regions. The first and simplest of these variations is the provision of the active base first prior to the provision of the inactive base. Thus, the method just described would be followed in its steps through the results shown in FIG. 1F. At that point, the successive implantation steps for providing the active base region would be performed in the manner described in connection with FIG. 1H. The result is shown in FIG. 4A where the deep implantation region is labeled 31' and the shallow implantation region is labeled 32', both shown before being merged in part into the inactive base region. Thereafter, a photoresist blocking layer is provided on major mask surface 21 of barrier masking layer 15 with openings in the blocking layer provided above those portions of scattering layer 27 below which the inactive region is to be provided in epitaxial layer 13. Again, the blocking layer is labeled 29. The results of the implantation step to provide the inactive base region 30 are shown in FIG. 4B. Regions 31' and 32' are there shown merged in part into region 30 with the remaining portions of those regions designated 31 and 32, respectively. Of course, integrated resistors can be made in the monolithic integrated circuit along with the implantation steps in this process variation just as in the process described in connection with FIG. 1.

The availability of this relatively simple interchange of process steps is advantageous for primarily process reasons. For instance, the photoresist used in forming blocking layer 29 can adversely affect the $SiO_2$ over which it is provided. So, for certain thicknesses of scattering layer 27, it may be desirable to provide the active base region first before scattering oxide 27 is covered with the photoresist blocking layer 29 required to provide the inactive base region 30.

Figure 5A:
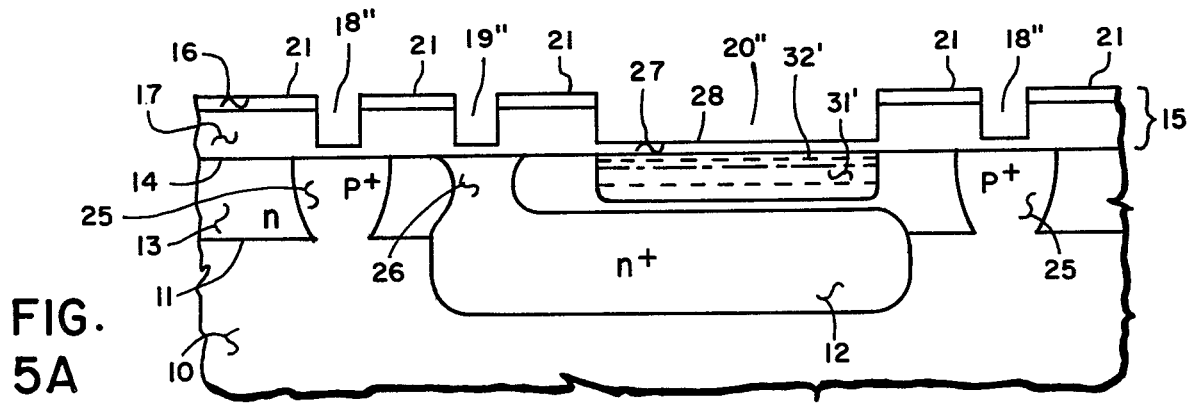
FIGS. 5A–5D shows the results of steps in the method embodying a variation of the invention.

Often, it will be desirable to have the emitter also self-aligned with the inactive base region so that tolerances can be reduced to allow for providing as small as emitter and base as possible to result in the smallest possible transistor. Particularly advantageous, the emitter and the inactive base can be provided in very close proximity to one another because tolerances can be reduced due to the self-alignment of the emitter. Thereby, the effective base resistance is reduced without affecting the base-emitter junction capacitance nor breakdown voltage. Again, the method described in connection with FIG 1 is flexible enough to permit this alternative. The process steps are again the same through FIG. 1F. As in the process described in connection with FIG. 4, the active base region at this point is provided in the manner described in connection with FIG. 1H and FIG. 4A. Thus, FIG. 4A is repeated as FIG. 5A.

Thereafter, provision is made for the emitter. A photoresist layer is provided as an etching mask on major mask surface 21 and on scattering layer surface 28 using a standard positive photoresist process. An opening is provided in the photoresist layer over a selected portion of scattering layer surface 28 below which the emitter region is desired to be provided. The $SiO_2$ in scattering layer 27 is then etched away below this opening in the photoresist layer to expose outer major surface 14 by the use of buffered hydrofluoric acid having a 20:1 ratio. Then, after the photoresist etching mask is removed and a deposition cleaning step is performed, arsenic doped polysilicon is deposited on a major mask surface 21, scattering layer surface 28 and on the exposed portion of outer major surface 14 to a depth of 3,000 Å. Again, the arsenic doping level in the polysilicon is as high as possible exceeding $1.0 \times 10^{20}$ atoms/cm$^3$.

$SiO_2$ is then either grown or deposited on the top surface of the doped polysilicon layer to serve as an etching mask, and a photoresist layer is provided on this $SiO_2$ to also serve as an etching mask in a standard positive photoresist process. The photoresist is then removed at every position below which there is not desired to be present any of the doped polysilicon layer. That is, the photoresist layer is removed at all points except above the position at which the emitter diffusant source and electrical contact for a transistor is to be provided. The $SiO_2$ not protected by the photoresist etching mask is then etched away down to the doped polysilicon layer by the use of a buffered hydrofluoric acid in a 20:1 ratio. The photoresist is then removed entirely and the doped polysilicon layer is etched away using the remaining $SiO_2$ etching mask to define the doped polysilicon layer portions to be retained by using a heated solution of nitric acid, hydrofluoric acid and acetic acid in a ratio of 10:1:11 in a standard etching process. The result is shown in FIG. 5B where again the emitter diffusant source is designated by the number 35. The $SiO_2$ etching mask portions remain on those portions of the doped polysilicon layer which are desired to be retained as indicated by the $SiO_2$ mask portion on top of emitter diffusant source 35 in FIG. 5B which is labeled 35'.

Figure 5B:
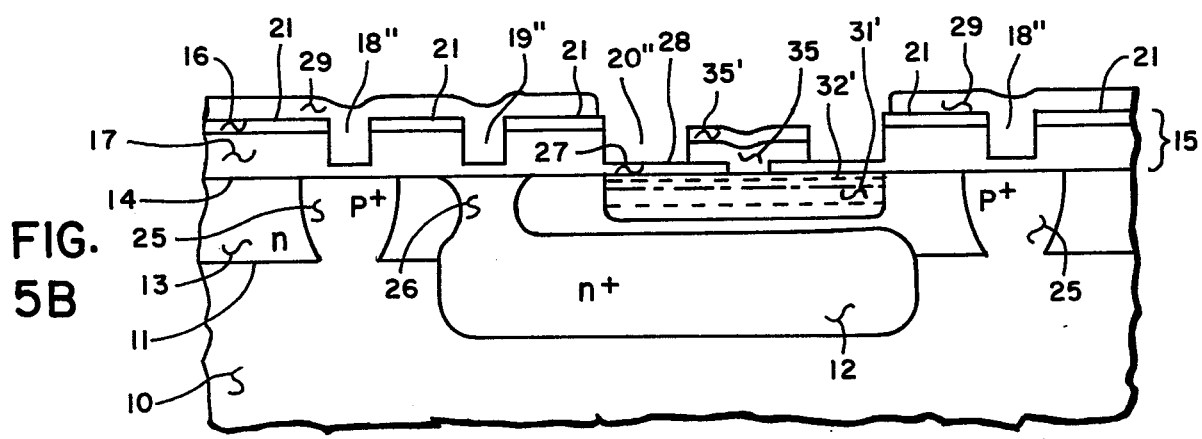

Following the etching of the doped polysilicon, a photoresist layer, 29, is provided on major mask surface 21 and in openings 18" and 19" as is also shown in FIG. 5B. Photoresist layer 29 prevents ions in the subsequent ion implantation step from being implanted in layer 13 through openings 18" and 19". Layer 29 is provided in a standard positive photoresist process with an opening provided therein to completely expose opening 20".

Figure 5C:
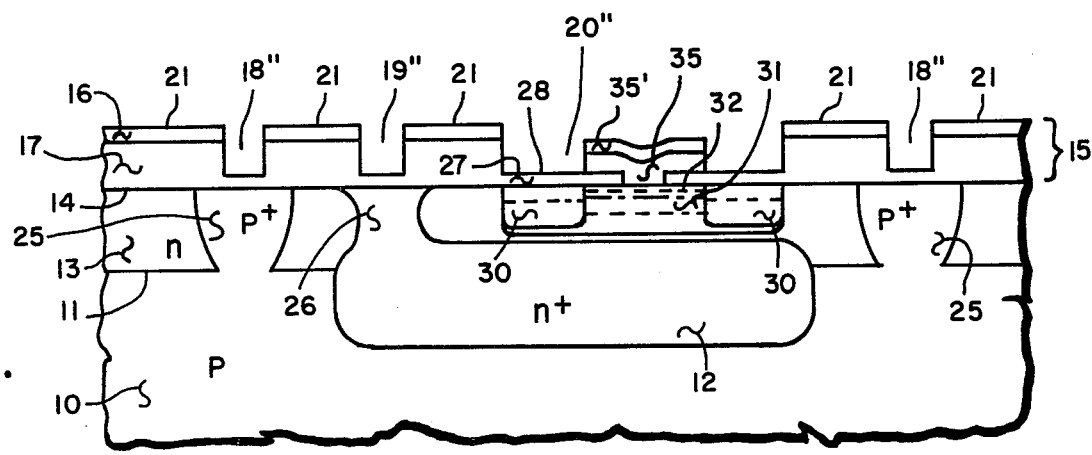

The structure as shown in FIG. 5B is then subjected to an ion implantation step to provide the inactive base region. The impinging ions are prevented from reaching the epitaxial layer 13 below emitter diffusant source 35 which is also serving as an implantation block. However, the ions do reach epitaxial layer 13 below scattering layer 27 at all locations around emitter diffusant source 35 to form the inactive base region again designated by the numeral 30. Thus, the emitter will be self-aligned with inactive base region 30 upon diffusion of the emitter from emitter diffusant source 35. The result of providing inactive base region 30 is shown in FIG. 5C. The deep implantation and shallow implantation regions in the active base region have been re-designated 31 and 32, respectively, after portions of region 31' and 32' in FIG. 1A have been merged with inactive base region 30 in FIG. 5G.

$Si_3N_4$ layer 16 is next etched away using a standard plasma etching process. Afterward, the structure shown in FIG. 5C, but without $Si_3N_4$ layer 16, is subjected to an annealing temperature cycle of 950° C for 15 minutes in a nitrogen atmosphere. Again, this is to electrically activate the implanted ions and repair lattice damage. Next, $SiO_2$ layer 17, including scattering layer 27 and etching mask remnant 35', are completely removed by etching through the use of buffered hydrofluoric acid having a 10:1 ratio. The exposed outer major surface 14 then has 1,500 Å of undoped $SiO_2$, designated by the numeral 36', thermally grown at 950° C thereon in a standard process, again done to avoid having the dopant in a subsequently provided doped $SiO_2$ layer from penetrating to outer major surface 14. This is followed by depositing, in a standard chemical vapor deposition process, a 10% phosphorous doped $SiO_2$ layer once more labeled 37' to a depth of 2,500 Å. Again, this is done because the doped $SiO_2$ is more impervious to most contaminants and because it will flow during the subsequent diffusion step to provide smooth contours.

Figure 5D:
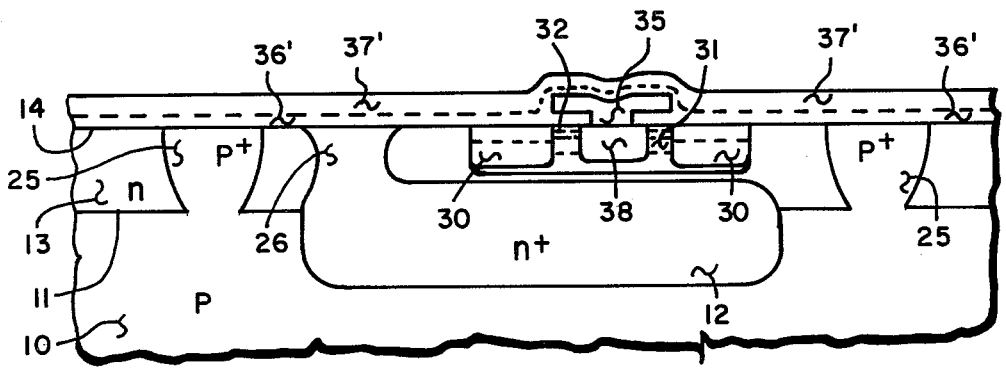

Thereafter, the structure thus prepared is submitted to an emitter diffusion cycle of 52 minutes is length at 1,025° C to provide the emitter region. As stated, the doped polysilicon is doped with arsenic in excess of $10^{20}$ atoms/cm$^3$ to take advantage of the concentration dependent diffusivity of arsenic. The result is shown in FIG. 5D where the emitter region is again designated by the numeral 38.

From this point onward, the process is essentially that described from a similar point in connection with FIG. 1. The result is that the inactive base is positioned very closely to the emitter as described. Again, of course, other transistors can be simultaneously formed in the monolithic integrated circuit and integrated resistors can be made in the monolithic integrated circuit in connection with the base implantation steps.

In a further alternative, the base and the emitter can be completely provided by ion implantation steps. This can lead to better control of the dimensions of the emitter region as opposed to the control available in diffusing the emitter region. With an implanted emitter region, no polysilicon diffusant source having a surface area larger than that of the emitter region is used so only the smaller emitter surface is available to be electrically contacted by the interconnection metallization network. Thus, in using a larger polysilicon surface for making electrical contact by the interconnection metallization network leads to tighter tolerances requirements for provision of that network, but permits a smaller bipolar transistor to be formed as there need not be portions in the transistor spaced apart by the polysilicon surface dimension.

In the variation shown here, the emitter is provided first before the various base related regions. However, the emitter region may be formed by ion implantation after the base related regions are formed, if this is more convenient in the integrated circuit fabrication process. In either case, the order in which the various base related regions are formed may be interchanged in order of formation as shown for the processes described in connection with FIGS. 1 and 4. In fact, the order of formation of any of the base regions or the emitter region may be interchanged at will where all of these regions are implanted. Once again, for the implantation step sequence shown here or for any of the other all-implantation method variations just referred to, the method begins as does the method described in connection with FIG. 1, with the steps in the method being same as those through FIG. 1F.

A first photoresist blocking layer is provided on major mask surface 21 of barrier masking layer 15 and on scattering layer surface 28 of scattering layer 27 of the structure shown in FIG. 1F. This is provided to confine the emitter region to be fabricated in an ion implantation step to a desired region in epitaxial layer 13 below scattering layer 27. This first blocking layer is again designated by the numeral 29 and is provided in a standard positive photoresist process. There is an opening provided in photoresist blocking layer 29 over that portion of scattering layer 27 below which the emitter region is desired to be provided. If very low value integrated resistors are to be provided in conjunction with providing emitter regions, proper openings in the photoresist layer 29 and in the barrier masking layer 15 must also be provided elsewhere at positions where such very low value integrated resistors are desired to be located in the monolithic integrated circuit. Of course, isolation regions must be provided for these resistors since the emitter region conductivity type is the same as that of epitaxial layer 13.

Figure 6A:
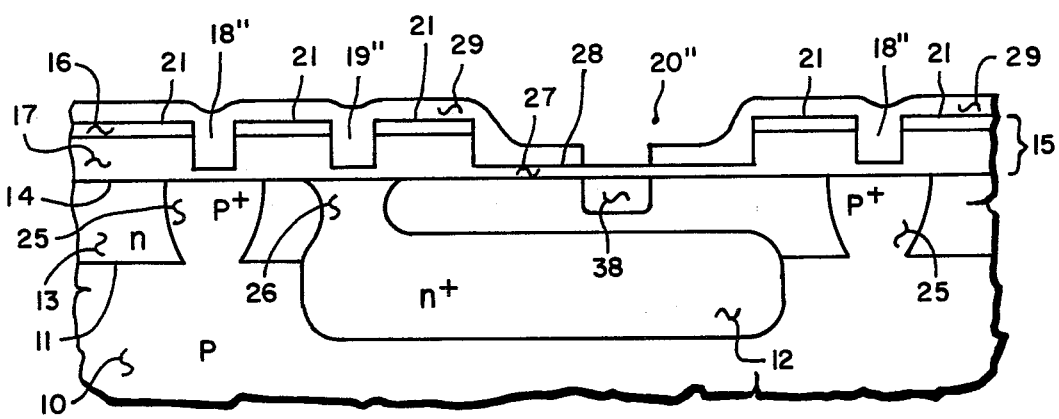

Since there will be no emitter push-out during diffusion of an emitter in this process variation in the absence of the use of diffusing to form the emitter, the emitter can be implanted using phosphorous ions. This has the advantage of allowing use of an ion implantation machine with less energy capability since phosphorous ions reach a greater depth than do arsenic ions for the same implantation energy. The phosphorous ions are implanted with an implantation energy of 300 kev and with a dose of $10^{16}$ atoms/cm$^2$. The result of this implantation step is to provide an emitter region, again designated 38, of n-type conductivity which has an effective sheet resistance of 10 $\Omega/\square$. The peak ion concentration in the emitter region 38 of $9 \times 10^{19}$ atoms/cm$^3$ occurs at 0.35 $\mu$m below outer major surface 14. The results are shown in FIG. 6A.

Photoresist blocking layer 29 is then removed entirely. A second blocking layer, again formed using photoresist, is provided on major mask surface 21 of barrier masking layer 15 and over scattering layer surface 28 of scattering layer 27. This blocking material layer, designated 29', is provided in a standard positive photoresist process with openings in the photoresist layer 29' over those portions of scattering layer 27 below which the inactive base region is desired to be provided.

Once again, openings in the photoresist layer 29' and in the barrier masking layer 15 can also be provided at positions in the monolithic integrated circuit where low value integrated resistors are to be provided in conjunction with provision of the inactive base region. These resistors would be intended to have a higher resistance value than those provided along with provision of the emitter region 38.

Figure 6B:
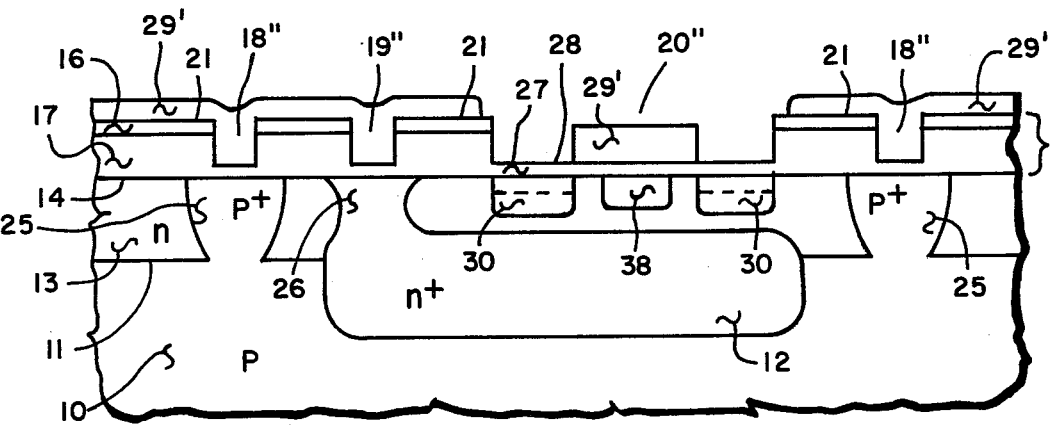

Upon completion of second blocking layer 29', being completed with the provision of the pertinent openings therein, the inactive base region ion implantation step is performed again using boron ions. Again, the boron ions are implanted with an energy of 120 kev and with a dose of $3.2 \times 10^{15}$ atoms/cm$^2$. As a result, the p$^+$-type conductivity inactive base region, again labeled 30, is provided having approximately the characteristics described for the region 30 in connection with FIG. 1. The results are shown in FIG. 6B where once more the dashed line indicates the location of maximum ion concentration in region 30. Again, region 30 is shown in two parts for accommodating a double base contact although a single contact will often suffice.

With the completion of the inactive base region 30, the photoresist layer 29' is removed completely. Thereafter, a deep implantation step is undertaken to form a p-type conductivity deep implantation region as part of the active base region. This region, again designated 31, is formed as before by implanting boron ions having an implantation energy of 190 kev through ion implantation opening 20" and through scattering layer 27 into epitaxial layer 13. The dose of this deep ion implantation steo is $3 \times 10^{13}$ atoms/cm$^2$. The peak ion concentration is marked by a short dashed line, see FIG. 6G, and region 31 here has about the same characteristics that the region 31 had in connection with FIG. 1.

The foregoing deep implantation step is followed by a shallow implantation step to form the shallow implantation region, again designated as 32 in FIG. 6G, required to form the remainder of the active base region. Here, boron ions are again implanted having an implantation energy of 100 kev and a dose of $1.0 \times 10^{14}$ atoms/cm$^2$. The shallow and deep implantation regions in the active base region are separated by a line of alternately short and long dashes. Region 32 in FIG. 6C has approximately the characteristics of region 32 provided in connection with FIG. 1. Where desired in conjunction with these ion implantation steps, barrier masking layer 15 can be opened to provide integrated resistors of a relatively high resistance value elsewhere in the monolithic integrated circuit.

Following these implantation steps, in structure is subjected to an annealing cycle at 950° C for 15 minutes in dry nitrogen. Results to this point are what is shown in FIG. 6C. Again, it should be noted that several of the emitter and active base regions now intersect one another in the manner described earlier with approximately the same relationships between these regions.

After annealing, barrier masking layer 15 is entirely removed from outer major surface 14 using the same steps where a similar removal is made in the method described in connection with FIG. 1. Thereafter, a new composite layer of SiO$_2$ is provided an outer major surface 14 by first growing 1,500 A layer of undoped SiO$_2$ followed by depositing 2,000 A layer of 10% phosphorous doped SiO$_2$ in a manner hereinbefore described. These two latter layers are designated by the numerals 36' and 37', respectively.

Openings are then provided in the composite SiO$_2$ layer consisting of layers 36' and 37' by a standard etching process in a manner described above for the collector contact, the base contacts, and the emitter contact. Since the emitter region is not provided by diffusion from a polysilicon diffusant source here as in the earlier described methods, a different metallization interconnection network construction must interface with the emitter region 38 for electrical interconnection. This is to avoid having the interconnection metallization network metal spiking through the emitter in the absence of the doped polysilicon intermediate layer. A satisfactory electrical connection can be made by forming platinum silicide at outer major surface 14 where it intersects emitter region 38. Then a composite metallization layer can be provided on the platinum silicide base thus formed beginning with titanium followed by platinum and gold. Similar contacts can be made conveniently for the base contacts and for the collector contact. The results are shown in FIG. 6D where the collector contact is labeled 39", the base contacts are labeled 40", and the emitter contact is labeled 41". The platinum silicide at the bottom of the contacts is not shown in the figure as it is very thin but the titanium layer is labeled 42, the platinum layer is labeled 43 and the gold layer is labeled 44.

The foregoing variations in the process associated with FIG. 1 show that the described processes have a substantial amount of design flexibility therein to satisfy differing needs in the construction of monolithic integrated circuits. The final variation in the process described in connection with FIG. 1 which is usable in all of the other variations also is the use of a barrier masking layer having more than two strata or layers therein. This variation was referenced earlier when there was a statement made that the process described in connection with FIG. 1 can be altered so that the pn junctions formed between the various regions provided in the process need never be uncovered during construction of the bipolar transistor. As pointed out there, no significant degradation in yield has been suffered due to the uncovering of these junctions as described in the foregoing processes and variations. However, the variation here using several strata in the barrier masking layer at the very least provides a barrier masking layer in which undercutting occurring during provision of openings therein is virtually eliminated. This permits better definition of the openings required to be provided in the process. In this variation the process steps are the same as those in the process described in connection with FIG. 1 through FIG. 1B.

The barrier masking layer, here, however, is provided in four strata or layers alternating between SiO$_2$ and Si$_3$N$_4$. The barrier masking layer is labeled by 15' and the first strata or layer used therein is an undoped SiO$_2$ layer, designated 17', which is provided by a standard thermal growth step on outer major surface 14 of epitaxial layer 13 at 950° C to a thickness of 2,000 A. This is followed by depositing Si$_3$N$_4$ by a standard chemical vapor deposition process to a depth of 1,500 A to form a layer designated as 16'. This, in turn, is followed by depositing an undoped SiO$_2$ layer by a standard chemical vapor deposition process to a depth of 3,000 A to form a layer labeled 45. Finally, the last layer, 46, is again Si$_3$N$_4$, provided by a standard chemical vapor deposition process to a depth of 1,500 A. The result is barrier masking layer 15' with major mask surface 21' as shown in FIG. 7A where again openings have been provided in the upper three strata or layers of barrier masking layer 15', i.e., what will be termed the upper composite layer. These openings have again been designated by the numeral 18 for the isolation region opening, by the numeral 19 for the collector sinker region opening, and by the numeral 20 for the base region opening, the latter being where an ion implantation opening will be fully formed.

Provision of these openings begins with providing a layer of photoresist on major mask surface 21' in a standard positive photoresist process to serve as an etching mask. Openings are provided in the photoresist over those portions of the upper composite layer in barrier masking layer 15' which are desired to be removed to form openings 18, 19 and 20. Thereafter, the Si$_3$N$_4$ layer 46 is opened through the photoresist layer to layer 45 using a standard plasma etch process. After layer 46 is opened the photoresist layer is removed. Then SiO$_2$ layer 45 is opened below the opening in layer 46 by a standard etching process using buffered hydrofluoric acid in a 20:1 ratio with the photoresist layer and layer 46 used as an etching mask. Finally, this is followed by using the same standard plasma etching process to open Si$_3$N$_4$ layer 16' using the photoresist layer and layers 45 and 46 as etching masks. Thereafter, the photoresist layer is removed.

The steps in which the isolation regions, the collector sinker, and the inactive and active base regions are provided exactly parallel those steps in the process described in connection with FIG. 1 if the upper composite layer of FIG. 7A takes the role of $Si_3N_4$ layer 16 in FIG. 1. The results of the steps are shown in corresponding FIGS. 7B, 7C, 7D and 7E.

At this point, however, there is a departure from the steps used in the method described in connection with FIG. 1. The layers 46 and 45 are stripped in standard etching processes from barrier masking layer 15' but layers 16' and 17' remain as a part of a reduced barrier masking layer, 15", to serve as part of the metallization interconnection support layer for the metallization interconnection system yet to be provided. The exposed surface of layer 16' is labeled 47. Layers 16' and 17' continue to cover all of the pn junctions formed to this point, i.e., those occurring as a result of forming the isolation region 25, the inactive base region 30 and the deep implantation region 31. This is true despite the opening of layer 17 in the openings 18", 19" and 20" all the way to major surface 14 which occurs during the removal of layers 45 and 46. The pn junction associated with isolated region 25 will have moved beyond the exposure of surface 14 by the opening of layer 17' as a result of diffusing those regions. The pn junction associated with the inactive and active base regions has also moved beyond the exposure of surface 14 by the opening of layer 17' as a result of the implantation step processing and the annealing cycle. So, by leaving layers 16' and 17', these pn junctions remain protected from exposure.

After the removal of layers 45 and 46, 1,500 Å of $SiO_2$ is thermally grown in the openings 18", 19" and 20" at 975° C for 90 minutes in dry oxygen. The result is shown in FIG. 7F where the openings have been relabeled 18''', 19''' and 20''' to reflect that a new surface due to the 1,500 Å of grown $SiO_2$ defines the bottom of these openings. The new 1,500 Å $SiO_2$ layer grown to define ion implantation opening 20''' is labeled 27' having surface 28'.

Figure 7G:
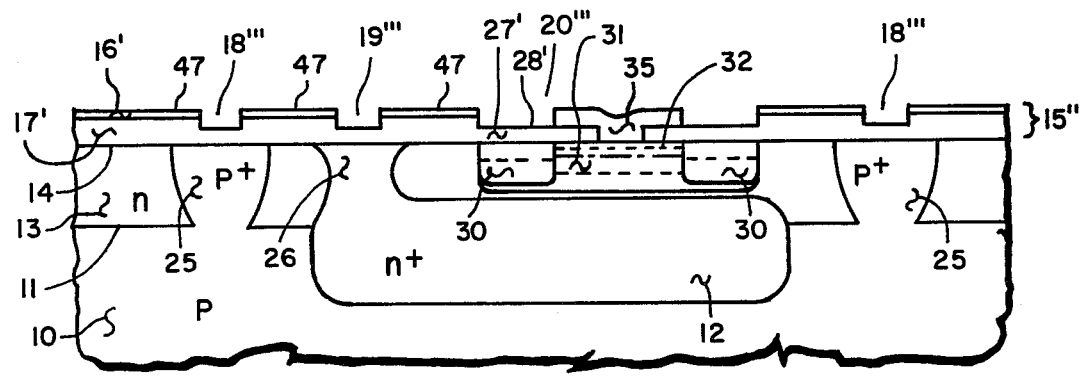

Now the emitter is provided in the same manner in which it was provided in the process described in connection with FIG. 1. A photoresist layer is provided as an etching mask over surface 47 and surface 28' as well as in the openings 18''' and 19'''. A standard positive photoresist process is used yielding a hole in the photoresist layer over layer 27' below which the emitter is desired to be formed in epitaxial layer 13. An opening is etched in $SiO_2$ layer 27' by etching through this opening in the photoresist layer with buffered hydrofluoric acid in a 20:1 ratio. The photoresist is afterwards removed and, following cleaning of the surface of layer 27' and surface 47, arsenic doped polysilicon is deposited by a standard chemical vapor deposition process on surface 47 and surface 28' and on outer major surface 14 through the opening in layer 27'. Of course, the polysilicon also forms in the openings 18''' and 19'''. The emitter diffusant source is defined from this deposition of doped polysilicon in just the manner used in the method described in connection with FIG. 1. The result is shown in FIG. 7G where the emitter diffusant source is again designated 35.

Figure 7H:
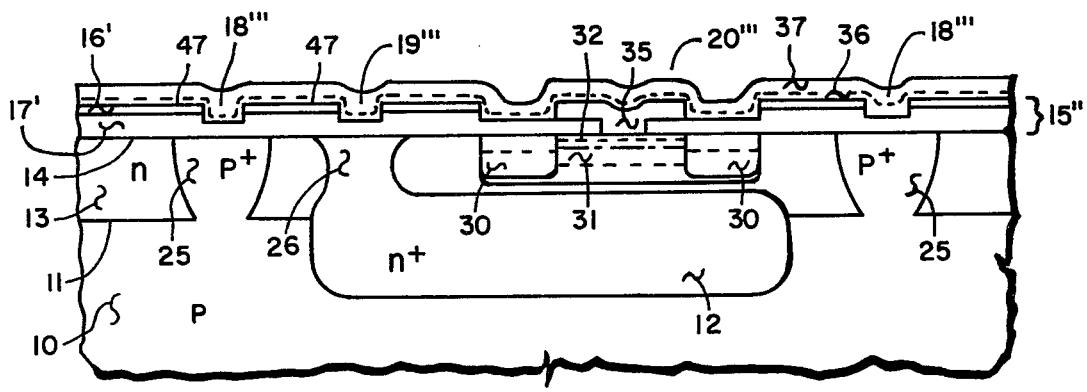
Figure 7I:
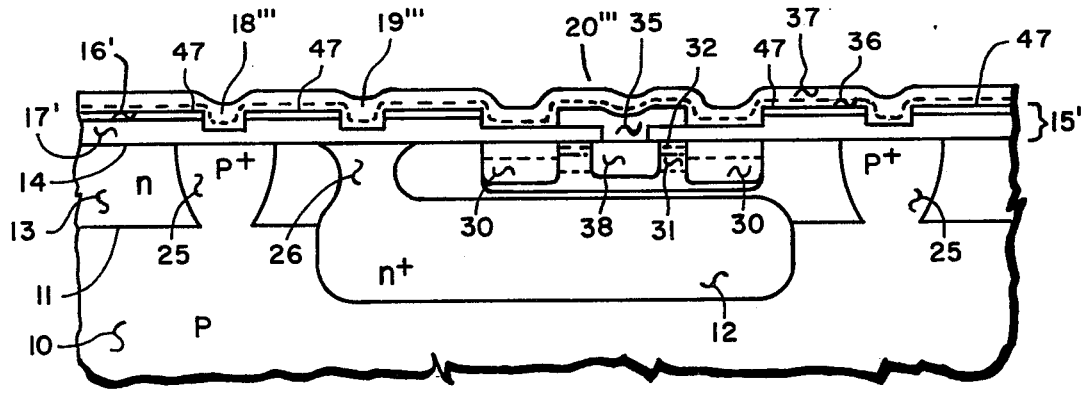
Figure 7J:
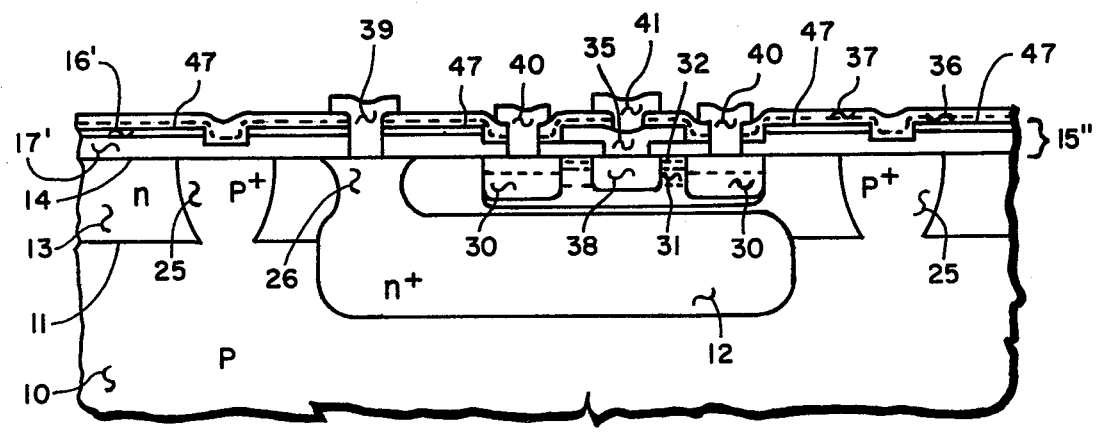

The remaining steps required to provide a bipolar transistor are just those in the method described in connection with FIG. 1. The results obtained in these remaining steps are shown in FIGS. 7H, 7I and 7J where the same numeral designations have been retained for similar structure components in a portion of the monolithic integrated circuit shown.

This method depends on the first two layers provided in the original barrier masking layer 15', there is layers 16' and 17', being sufficiently thin so that these layers with $SiO_2$ layers 36 and 37 later added will be in total thin enough to allow the interconnection metallization network to electrically and physically contact selected regions in outer major surface 14 without breaks developing in the interconnection metallization circuit over the edges of openings in reduced barrier masking layer 15" provided to allow such contacts to surface 14. The further result of having $Si_3N_4$ layer 17' over a great fraction of the surface of the monolithic integrated circuit provides added passivation protection against contaminants migrating to reach outer major surface 14.

The embodiments of the invention in which an exclusive property or right is claimed are defined as follows:

1. A method for constructing a bipolar transistor at an outer major surface of a first semiconductor material layer of a first conductivity type with said bipolar transistor having a base region which includes a plurality of ion implanted regions, said method comprising:

providing on said outer major surface a barrier masking layer having a major mask surface not in contact with said outer major surface, said barrier masking layer being capable, where not opened, of preventing implantation therethrough in said first semiconductor material layer of any kinds of ions which are to be implanted in said first semiconductor material layer in each implantation step following in said method in which said barrier masking layer is present;

providing, above a location in said first semiconductor material layer where said base region is desired to be located, a first ion implantation opening in said barrier masking layer extending partially therethrough from said major mask surface with a scattering layer, having a scattering layer surface, provided between said first ion implantation and said outer major surface such that said scattering layer surface serves as a termination to said first ion implantation opening, to thereby provide a masked structure, said scattering layer capable of permitting ion implantation therethrough in said first semiconductor material layer in at least one ion implantation step following in said method in which said scattering layer is present;

implanting at least ions of a first kind in said first semiconductor material layer, in a plurality of ion implantation steps, including a first implantation, by impinging a kind ions in each said implantation step on said masked structure, including impinging them through said first ion implantation opening, to thereby form a plurality of regions, including a first region of a second conductivity type, in said first semiconductor material layer;

providing on said outer major surface in place of said barrier masking layer an interconnection support layer having an exposed major support surface not in contact with said outer major surface to thereby provide a protected structure, where said interconnection support layer is capable of permitting at least one kind of ions to be implanted therethrough in said first semiconductor material layer at any location under said interconnection support layer through a repetition of at least one aforesaid implantation step occurring in said method;

providing an electrical contact opening in said interconnection support layer from said major support surface; and providing a device electrical interconnection system on said major support surface which makes electrical contact with said first semiconductor material layer at said outer major surface through said electrical contact opening.

2. The method of claim 1 wherein said providing of said interconnection support layer is accomplished by removing said barrier masking layer entirely before at least one layer of new material is provided to serve as said interconnection support layer.

3. The method of claim 1 wherein said providing of said interconnection support layer is accomplished by removing only some layer portions of said barrier masking layer with remaining layer portions of said barrier masking layer serving as a part of said interconnection support layer.

4. The method of claim 1 wherein said barrier masking layer comprises first and second masking layers with said second masking layer being provided on said outer major surface between said first masking layer and said first semiconductor material layer.

5. The method of claim 1 wherein said providing of said first ion implantation opening is followed by providing a first blocking material layer on said major mask surface and on said scattering layer surface where said first blocking material layer is capable, as provided and where not opened, of preventing implantation in said first semiconductor material layer of said first kind ions in said first implantation, said first blocking material layer having a second ion implantation opening provided therein which exposes only a portion of said scattering layer.

6. The method of claim 1 wherein said first implantation is followed by providing a first blocking material layer on said major mask surface and on said scattering layer surface where said first blocking material layer is capable, as provided and where not opened, of preventing implantation in said first semiconductor material layer of any kinds of ions which are to be implanted in said first semiconductor material layer in a manner set out in any implantation steps following in said method in which said first blocking material layer is present, said first blocking material layer having a second ion implantation opening therein which exposes only a portion of said scattering layer.

7. The method of claim 1 wherein said first implantation is followed by:
providing a deposition opening in said scattering layer extending through said scattering layer from said scattering layer surface; and
depositing doped polysilicon, having a first dopant therein, such that said doped polysilicon is provided in said deposition opening and on portions of said scattering layer but with selected portions of said scattering layer being uncovered by said doped polysilicon.

8. The method of claim 4 wherein said providing of said first ion implantation opening is accomplished in conjunction with providing first and second diffusion openings in said barrier masking layer, said providing of said first ion implantation opening being accomplished in part by providing a first opening in said first masking layer, said providing of said first diffusion opening being accomplished in part by providing a second opening in said first masking layer simultaneously with said providing of said first opening in said first masking layer where said second opening in said first masking layer completely surrounds said first opening in said first masking layer, said providing of said second diffusion opening being accomplished in part by providing a third opening in said first masking layer simultaneously with said providing of said first and second openings in said first masking layer where said third opening in said first masking layer is completely surrounded by said second opening in said first masking layer but which does not intersect said first opening in said first masking layer.

9. The method of claim 4 wherein said first masking layer is more resistant, for a given thickness thereof, than is said second masking layer, for a similar thickness, to penetration of ions impinging thereon in a manner set out in one or more implantation steps in said method, and where said second masking layer is better matched to said first semiconductor material layer with respect to thermal expansion characteristics than is said first masking layer; said first masking layer being of a thickness substantially near or equal to that maximum thickness thereof which can be provided in said barrier masking layer without cracking those portions of said barrier masking layer upon which said first masking layer is positioned, and with said second masking layer being of whatever thickness is further required to render said barrier masking layer capable of preventing implantation as aforesaid.

10. The method of claim 4 wherein said first masking layer is part of an upper composite layer, said upper composite layer comprising said first masking layer and third and fourth masking layers with said third and fourth masking layers being provided between said first and second masking layers such that said third masking layer is provided between said first masking layer and said fourth masking layer.

11. The method of claim 5 wherein said first implantation also occurs through said second ion implantation opening and is followed by:
removing said first blocking material layer; and
implanting ions of a second kind in said first semiconductor material layer, as a second implantation, by impinging said second kind ions on said masked structure including impinging them through said first ion implantation opening, to thereby form a second region in said first semiconductor material layer of a third conductivity type.

12. The method of claim 5 wherein said first implantation also occurs through said second ion implantation opening and is followed by:
removing said first blocking material layer;
providing a second blocking material layer on said major mask surface and on said scattering layer surface where said second blocking material layer is capable, as provided and where not opened, of preventing implantation in said first semiconductor material layer of any kinds of ions which are to be implanted in said first semiconductor material layer in a manner set out in any implantation steps following in said method in which said second blocking material layer is present, said second blocking material layer having a third ion implantation opening therein which exposes only a portion of said scattering layer; and
implanting ions of a second kind in said first semiconductor material layer, as a second implantation, by impinging said second kind ions on said masked structure with said second blocking layer including impinging them through said first and third ion implantation openings, to thereby form a second region in said first semiconductor material layer of a third conductivity type.

13. The method of claim 5 wherein said first implantation also occurs through said second ion implantation opening and is followed by:
removing said first blocking material layer; and
implanting ions of a second kind in said first semiconductor material layer, as a second implantation, by impinging said second kind ions on said masked structure including impinging them through said first ion implantation opening, to thereby form a second region in said first semiconductor layer which intersects said first region.

14. The method of claim 6 wherein said providing of said first blocking material is followed by:
implanting ions of a second kind in said first semiconductor material layer, as a second implantation, by impinging said second kind ions on said masked structure with said first blocking layer including impinging them through said first and second ion implantation openings, to thereby form a second region in said first semiconductor material layer of a third conductivity type.

15. The method of claim 7 wherein said providing of said doped polysilicon is followed by:
implanting ions of a second kind in said first semiconductor material layer, as a second implantation, by impinging said second kind ions on said masked structure with said doped polysilicon including impinging them through said first ion implantation opening, to thereby form a second region in said first semiconductor layer of a third conductivity type; and
annealing said masked structure.

16. The method of claim 8 wherein said providing of said first, second and third openings in said first masking layer is accomplished by plasma etching.

17. The method of claim 8 wherein said providing of said interconnection support layer is accomplished by removing said barrier masking layer entirely before at least one layer of new material is provided to serve as said interconnection support layer.

18. The method of claim 8 wherein said providing of said first, second and third openings in said first masking layer is followed by:
opening said barrier masking layer to said outer major surface through said second opening in said first masking layer and depositing a first diffusant on said outer major surface through said second opening in said first masking layer;
providing a covering layer over said outer major surface where said first diffusant has been provided, as aforesaid;
opening said barrier masking layer to said outer major surface through said third opening in said first masking layer and depositing a second diffusant on said outer major surface through said third opening in said first masking layer;
opening said barrier masking layer to said outer major surface through said first and second openings in said first masking layer; and
diffusing said first and second diffusants into said first semiconductor material layer while providing said scattering layer in conjunction therewith.

19. The method of claim 10 wherein said providing of said first ion implantation opening is accomplished in conjunction with providing first and second diffusion openings in said barrier masking layer, said providing of said first ion implantation opening being accomplished in part by providing a first opening in said upper composite layer, said providing of said first diffusion opening being accomplished in part by providing a second opening in said upper composite layers simultaneously with said providing of said first opening in said upper composite layer where said second opening in said upper composite layer completely surrounds said first opening in said upper composite layer, said providing of said second diffusion opening being accomplished in part by providing a third opening in said upper composite layer simultaneously with said providing of said first and second openings in said upper composite layer where said third opening in said upper composite layer is completely surrounded by said second opening in said upper composite layer but which does not intersect said first opening in said upper composite layer.

20. The method of claim 11 wherein said second implantation is followed by:
implanting ions of a third kind in said first semiconductor material layer, as a third implantation, by impinging said third kind ions on said masked structure including impinging them through said first ion implantation opening, to thereby form a third region in said first semiconductor material layer of a fourth conductivity type; and
annealing said masked structure.

21. The method of claim 12 wherein said second implantation is followed by:
removing said second blocking material layer; and
implanting ions of a third kind in said first semiconductor material layer, as a third implantation, by impinging said third kind ions on said masked structure including impinging them through said first ion implantation opening, to thereby form a third region in said first semiconductor material layer which intersects said first and second regions.

22. The method of claim 13 wherein said third implantation is followed by:
providing a second blocking material layer on said barrier masking layer and on said scattering layer where said second blocking material layer is capable, as provided and where not opened, of preventing implantation in said first semiconductor layer of any kinds of ions which are to be implanted in said first semiconductor material layer in a manner set out in any implantation steps following in said method in which said second blocking material layer is present, said second blocking material layer having a third ion implantation opening therein which exposes only a portion of said scattering layer;
implanting ions of a third kind in said first semiconductor material layer, as a third implantation, by impinging said third kind ions on said masked structure with said second blocking layer including impinging them through said first and third ion implantation openings, to thereby form a third region in said first semiconductor material layer;
removing said second blocking material layer; and
annealing said masked structure.

23. The method of claim 14 wherein (i) said first implantation is followed by, and (ii) said providing of said first blocking material layer is preceded by implanting ions of a third kind in said first semiconductor material layer, as a third implantation, by impinging said third kind ions on said masked structure including impinging them through said first ion implantation opening, to thereby form a third region in said first semiconductor material layer of a fourth conductivity type.

24. The method of claim 15 wherein (i) said first implantation is followed by, and (ii) said depositing of doped polysilicon is preceded by implanting ions of a third kind in said first semiconductor material layer, as a third implantation, by impinging said third kind ions on said masked structure including impinging them through said first ion implantation opening, to thereby form a third region in said first semiconductor layer of a fourth conductivity type.

25. The method of claim 18 wherein said first masking layer is more resistant, for a given thickness thereof, than is said second masking layer, for a similar thickness, to penetration of ions impinging thereon in a manner set out in one or more implantation steps in said method, and where said second masking layer is better matched to said first semiconductor material layer with respect to thermal expansion characteristics than is said first masking layer; said first masking layer being of a thickness substantially near or equal to that in maximum thickness thereof which can be provided in said barrier masking layer without cracking those portions of said barrier masking layer upon which said first masking layer is positioned, and with said second masking layer being of whatever thickness is further required to render said barrier masking layer capable of preventing implantation as aforesaid.

26. The method of claim 18 wherein a plurality of implantation steps occurs all involving impinging ions through said first ion implantation opening, including said first implantation, where there occurs between two of said plurality of implantation steps a step of providing a blocking material layer on said barrier masking layer and on said scattering layer with said blocking material layer being capable, as provided, where not opened, of preventing implantation in said first semiconductor material layer of any kinds of ions which are to be implanted in said first semiconductor material layer in a manner set out in any implantation steps following in said method in which said blocking material layer is present, said blocking material layer having a second ion implantation opening therein which exposes only a portion of said scattering layer and through which ions are impinged on said masked structure in one or more implantation steps following in said method.

27. The method of claim 19 wherein said providing of said interconnection support layer is accomplished by removing only some layer portion of said barrier masking layer with remaining layer portions of said barrier masking layer serving as a part of said interconnection support layer.

28. The method of claim 19 wherein said providing of said first, second and third openings in said upper composite layer is followed by:
opening said barrier masking layer to said outer major surface through said second opening in said upper composite layer and depositing a first diffusant on said outer major surface through said second opening in said upper composite layer;
providing a covering layer over said outer major surface where said first diffusant has been provided as aforesaid;
opening said barrier masking layer to said outer major surface through said third opening in said upper composite layer and depositing a second diffusant on said outer major surface through said third opening in said upper composite layer;
opening said barrier masking layer to said outer major surface through said first and second openings in said upper composite layer; and
diffusing said first and second diffusants into said first semiconductor layer while providing said scattering layer in conjunction therewith.

29. The method of claim 20 wherein said providing of said interconnection support layer is followed by:
providing a deposition opening in said interconnection support layer extending through said interconnection support layer;
depositing doped polysilicon having therein a first dopant exhibiting a concentration dependent diffusivity, said first dopant being present in a concentration sufficient to take advantage of said concentration dependent diffusivity, said doped polysilicon being provided in said deposition opening; and
diffusing said first dopant out of said doped polysilicon into said first semiconductor layer to form a fourth region in said first semiconductor layer of a fifth conductivity type which intersects said second and third regions and renders those portions of said second and third regions where intersected to be no longer of said third and fourth conductivity types respectively, said first region intersecting also said second and third regions, said fourth region extending into said first semiconductor layer from said outer major surface to locations deeper than those locations of maximum concentration of either said second or third kind ions, said first and fifth conductivity types being a common conductivity type and said second, third and fourth conductivity types being a common conductivity type which is opposite to that conductivity type common to said first and fifth conductivity types.

30. The method of claim 21 wherein said third implantation is followed by:
implanting ions of a fourth kind in said first semiconductor material layer, as a fourth implantation, by impinging said fourth kind ions on said masked structure including impinging them through said first ion implantation opening, to thereby form a fourth region in said first semiconductor material layer which intersects said first and second regions, said third region being of a fourth conductivity type except where said third region intersects said first region, said fourth region being of a fifth conductivity type except where said fourth region intersects said first region, said first region extending into said first semiconductor layer from said outer major surface to locations deeper than those locations of maximum concentration of either said third or fourth kind ions; and
annealing said masked structure, said first and second conductivity types being a common conductivity type and said third, fourth and fifth conductivity types being a common conductivity type which is opposite to that conductivity type common to said first and second conductivity types.

31. The method of claim 21 wherein said third implantation is followed by:
implanting ions of a fourth kind in said first semiconductor material layer, as a fourth implantation, by impinging said fourth kind ions on said masked structure including impinging them through said first ion implantation opening, to thereby form a fourth region in said first semiconductor material layer which intersects said first and second regions, said third region being of a fourth conductivity type except where said third region intersects said second region, said fourth region being of a fifth conductivity type except where said fourth region intersects said second region, said second region extending into said first semiconductor material layer from said outer major surface to locations deeper than those locations of maximum concentration of either said third or fourth kind ions; and annealing said masked structure, said first and third conductivity types being a common conductivity type and said second, fourth and fifth conductivity types being a common conductivity type which is opposite to that conductivity type common to said first and third conductivity types.

32. The method of claim 22 wherein (i) said second implantation is followed by, and (ii) said providing of said second blocking layer is preceded by:

implanting ions of a fourth kind in said first semiconductor material layer, as a fourth implantation, by impinging said fourth kind ions on said masked structure including impinging them through said first ion implantation opening, to thereby form a fourth region in said first semiconductor material layer which intersects said first and third regions, said second region intersecting also said third region with said second region being of a third conductivity type except where said second region intersects said first region, said third region being of a fourth conductivity type, said fourth region being of a fifth conductivity type except where said fourth region intersects said first region, said first region extending into said first semiconductor material layer from said outer major surface to locations deeper than those locations of maximum concentration of either said second of fourth kind ions, said first and second conductivity types being a common conductivity type and said third, fourth and fifth conductivity types being a common conductivity type which is opposite to that conductivity type common to said first and second conductivity types.

33. The method of claim 22 wherein (i) said second implantation is followed by, and (ii) said providing of said second blocking layer is preceded by:

implanting ions of a fourth kind in said first semiconductor material layer, as a fourth implantation, by impinging said fourth kind ions on said masked structure including impinging them through said first ion implantation opening, to thereby form a fourth region in said first semiconductor material layer which intersects said first and third regions, said second region intersecting also said third region with said second region being of a third conductivity type except where said second region intersects said third region, said third region being of a fourth conductivity type, said fourth region being of a fifth conductivity type except where said fourth region intersects said third region, said third region extending into said first semiconductor material layer from said outer major surface to locations deeper than those locations of maximum concentration of either said second or fourth kind ions, said first and fourth conductivity types being a common conductivity type and said second, third and fifth conductivity types being a common conductivity type which is opposite to that conductivity type common to said first and fourth conductivity types.

34. The method of claim 23 wherein said second implantation step is followed by annealing said masked structure and said providing of said interconnection support layer is followed by:

providing a deposition opening in said interconnection support layer extending through said interconnection support layer;

depositing doped polysilicon having therein a first dopant exhibiting a concentration dependent diffusivity, said first dopant being present in a concentration sufficient to take advantage of said concentration dependent diffusivity, said doped polysilicon being provided in said deposition opening; and diffusing said first dopant out of said doped polysilicon into said first semiconductor layer to form a fourth region in said first semiconductor layer of a fifth conductivity type which intersects said first and third regions and renders those portions of said first and third regions where intersected to be no longer of said second and fourth conductivity types respectively, said second region intersecting also said first and third regions, said fourth region extending into said first semiconductor layer from said outer major surface to locations deeper than those locations of maximum concentration of either said first or third kind ions, said first and fifth conductivity types being a common conductivity type and said second, third and fourth conductivity types being a common conductivity type which is opposite to that conductivity type common to said first and fifth conductivity types.

35. The method of claim 23 wherein said second implantation is followed by:

removing said first blocking material layer;

providing a second blocking material layer on said major mask surface and on said scattering layer surface where said second blocking material layer is capable, as provided and where not opened, of preventing implantation in said first semiconductor layer of any kinds of ions which are to be implanted in said first semiconductor material layer in a manner set out in any implantation steps following in said method in which said second blocking material layer is present, said second blocking material layer having a third ion implantation opening therein which exposes only a portion of said scattering layer;

implanting ions of a fourth kind in said first semiconductor material layer, as a fourth implantation, by impinging said fourth kind ions on said masked structure with said second blocking layer including impinging them through said first and third ion implantation openings, to thereby form a fourth region in said fourth semiconductor material layer of a fifth conductivity type which intersects said first and third regions and renders those portions of said first and third regions where intersected to be no longer of said second and fourth conductivity types respectively, said second region intersecting also said first and third regions, said fourth region extending into said first semiconductor layer from said outer major surface to locations deeper than those locations of maximum concentration of either said first or third kind ions; p1 removing said second blocking material layer; and
annealing said masked structure.

36. The method of claim 24 wherein said providing of said interconnection support layer is followed by diffusing said first dopant out of said doped polysilicon into said first semiconductor layer to form a fourth region in said first semiconductor layer of a fifth conductivity type which intersects said first and third regions and renders those portions of said first and third regions where intersected to be no longer of said second and fourth conductivity types respectively, said second region intersecting also said first and third regions, said fourth region extending into said first semiconductor layer from said outer major surface to locations deeper than those locations of maximum concentration of either said first or third kind ions, said first dopant both exhibiting a concentration dependent diffusivity and being present in sufficient concentration to take advantage of said concentration diffusivity.

37. The method of claim 25 wherein said first masking layer is silicon nitride having a thickness of between 1,500 Å and 2,000 Å and said second masking layer is silicon dioxide.

38. The method of claim 28 wherein said first masking layer is silicon nitride, said second masking layer is silicon dioxide, said third masking layer is silicon dioxide, and said fourth masking layer is silicon nitride; and wherein said providing of said interconnection support layer is accomplished by removing only said first and third masking layers with said second and fourth masking layers remaining to serve as a part of said interconnection support layer.

39. The method of claim 28 wherein a plurality of implantation steps occurs all involving impinging ions through said first ion implantation opening, including said first implantation, where there occurs between two of said plurality of implantation steps a step of providing a blocking material layer on said barrier masking layer and on said scattering layer with said blocking material layer being capable, as provided, where not opened, of preventing implantation in said first semiconductor material layer of any kinds of ions which are to be implanted in said first semiconductor material layer in a manner set out in any implantation steps following in said method in which said blocking material layer is present, said blocking material layer having a second ion implantation opening therein which exposes only a portion of said scattering layer and through which ions are impinged on said masked structure in one or more implantation steps following in said method.

40. A method for constructing a bipolar transistor at an outer major surface of a first semiconductor material layer of a first conductivity type, said method comprising:
providing on said outer major surface a barrier masking layer having an exposed major mask surface not in contact with said outer major surface, said barrier masking layer being capable, where not opened, of preventing implantation therethrough in said first semiconductor material layer of any kinds of ions which are to be implanted in said first semiconductor material layer in each implantation step following in said method in which said barrier masking layer is present;
providing, above a location in said first semiconductor material layer where both active and inactive base regions are desired to be located, a first ion implantation opening in said barrier masking layer extending partially therethrough from said major mask surface with a scattering layer, having a scattering surface, provided between said first ion implantation opening in said outer major surface such that said scattering layer surface serves as a termination to said first ion implantation opening, to thereby provide a masked structure, said scattering layer capable of permitting ion implantation therethrough in said first semiconductor layer in at least one implantation step following in said method in which said scattering layer is present;
implanting ions of at least one kind in said first semiconductor material layer, in a plurality of implantation steps, by impinging a kind of ions in each said implantation step on said masked structure, including impinging them through said first ion implantation opening, to thereby form a plurality of regions in said first semiconductor material layer of selected conductivity types including said inactive and active base regions;
providing a first blocking layer before performing a first selected step of said plurality of implantation steps in which said inactive base region is formed at least in part, said first blocking layer being provided at least on said scattering layer surface where said first blocking material layer is capable, as provided and where not opened, of preventing implantation in said first semiconductor material layer of any kinds of ions which are to be implanted in said first semiconductor material layer in each implantation step following in said method in which said first blocking material layer having a second ion implantation opening therein which exposes only a portion of said scattering layer, and thereafter performing said first selected implantation step by impinging a kind of ions on said masked structure with said first blocking layer and through said first and second ion implantation openings.

41. The method of claim 40 wherein said implanting of ions is accomplished in part by implanting ions in second and third selected steps of said plurality of implantation steps to form said active base region.

42. The method of claim 40 wherein said implanting of ions is accomplished in part by implanting ions in a second selected step of said plurality of implantation steps which occurs prior to said providing of said first blocking layer to form at least a portion of said active base region.

43. The method of claim 40 wherein said implanting of ions is accomplished in part by implanting ions in a second selected step of said plurality of implantation steps which occurs both after said first selected implantation step and after removing said first blocking layer from said scattering layer surface to form at least a portion of said active base region.

44. The method of claim 40 wherein there occurs a providing of a second blocking layer, said second blocking layer being provided on said scattering layer surface where said first blocking material layer is capable, as provided and where not opened, of preventing implantation in said first semiconductor material layer of any kinds of ions which are to be implanted in said first semiconductor material layer in a manner set out in any implantation steps following in said method in which said second blocking material layer is present, said second blocking material layer having a third ion implantation opening therein which exposes only a portion of said scattering layer; and thereafter accomplishing said implanting of ions in part by implanting ions in a second selected implantation step in said plurality of implantation steps by impinging a kind of ions on said masked structure with said second blocking layer and through said first and third ion implantation openings to form an emitter region.

45. The method of claim 40 wherein there occurs a providing of a doped polysilicon emitter diffusant source, doped with a first dopant, said doped polysilicon diffusant source being provided in an opening in said scattering layer which exposes a portion of said outer major surface, and thereafter diffusing said first dopant out of said doped polysilicon emitter diffusant source into said first semiconductor material layer to form an emitter region.

46. The method of claim 44 wherein said providing of said second blocking layer and said performing of said second selected step occurs prior to said providing of said first blocking layer, and said second blocking layer being removed after said performing of said second selected step.

47. The method of claim 44 wherein said providing of said second blocking layer and said preforming of said second selected step occurs after said performing of said first selected step, and said first blocking layer being removed after said performing of said first selected step.

48. The method of claim 44 wherein said emitter region intersects said active base region and extends deeper into said first semiconductor material layer from said outer major surface than do all locations in said active base region exhibiting ion concentration maximas.

49. The method of claim 44 wherein said implanting of ions is accomplished in part by implanting ions in third and fourth selected steps of said plurality of implantation steps to form said active base region.

50. The method of claim 45 wherein said doped polysilicon emitter diffusant source is provided after said providing of said first blocking material layer and after said performing of said first selected step, said first blocking material layer being removed after said performing of said first selected step.

51. The method of claim 45 wherein said emitter region intersects said active base region and extends deeper into said first semiconductor material layer from said outer major surface than do all locations in said active base region exhibiting ion concentration maximas.

52. The method of claim 45 wherein said implanting of ions is accomplished in part by implanting ions in second and third selected steps of said plurality of implantation steps to form said active base region.

* * * * *